US011075283B2

(12) United States Patent
Wu et al.

(10) Patent No.: US 11,075,283 B2
(45) Date of Patent: Jul. 27, 2021

(54) DIELECTRIC CONSTANT REDUCTION OF GATE SPACER

(71) Applicant: TAIWAN SEMICONDUCTOR MANUFACTURING CO., LTD., Hsinchu (TW)

(72) Inventors: Xu-Sheng Wu, Hsinchu (TW); Chang-Miao Liu, Hsinchu (TW); Hui-Ling Shang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/592,372

(22) Filed: Oct. 3, 2019

(65) Prior Publication Data

US 2020/0135887 A1   Apr. 30, 2020

Related U.S. Application Data

(60) Provisional application No. 62/752,868, filed on Oct. 30, 2018.

(51) Int. Cl.
| H01L 29/66 | (2006.01) |
| H01L 21/3115 | (2006.01) |
| H01L 27/092 | (2006.01) |
| H01L 21/3205 | (2006.01) |
| H01L 29/49 | (2006.01) |
| H01L 21/311 | (2006.01) |

(52) U.S. Cl.
CPC ...... *H01L 29/6656* (2013.01); *H01L 21/3115* (2013.01); *H01L 21/31144* (2013.01); *H01L 21/32055* (2013.01); *H01L 27/0924* (2013.01); *H01L 29/4983* (2013.01); *H01L 29/66545* (2013.01)

(58) Field of Classification Search
CPC .......... H01L 29/6656; H01L 29/66545; H01L 29/4983; H01L 21/3115; H01L 21/32055; H01L 21/31144; H01L 27/0924
See application file for complete search history.

(56) References Cited

U.S. PATENT DOCUMENTS

2015/0102416 A1* 4/2015 Yin .................. H01L 21/28026
257/369
2016/0181108 A1* 6/2016 Kelly ................ H01L 21/28194
438/585

* cited by examiner

*Primary Examiner* — Vongsavanh Sengdara
(74) *Attorney, Agent, or Firm* — Maschoff Brennan

(57) ABSTRACT

A method includes forming a dummy gate structure over a substrate, forming a plurality of gate spacers respectively on opposite sidewalls of the dummy gate structure and having a first dielectric constant, removing the dummy gate structure to form a gate trench between the gate spacers, forming a dopant source layer to line the gate trench, annealing the dopant source layer to diffuse k-value reduction impurities from the dopant source layer into the gate spacers to lower the first dielectric constant of the gate spacers to a second dielectric constant, and forming a replacement gate stack in the gate trench.

20 Claims, 37 Drawing Sheets

US 11,075,283 B2

DIELECTRIC CONSTANT REDUCTION OF GATE SPACER

PRIORITY CLAIM AND CROSS-REFERENCE

This application claims priority to U.S. Provisional Application Ser. No. 62/752,868, filed Oct. 30, 2018, which is herein incorporated by reference.

BACKGROUND

Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3B-14A and 15-17 illustrate cross-sectional views of intermediate stages in the formation of transistors in accordance with some embodiments.

DETAILED DESCRIPTION

Figure 1:
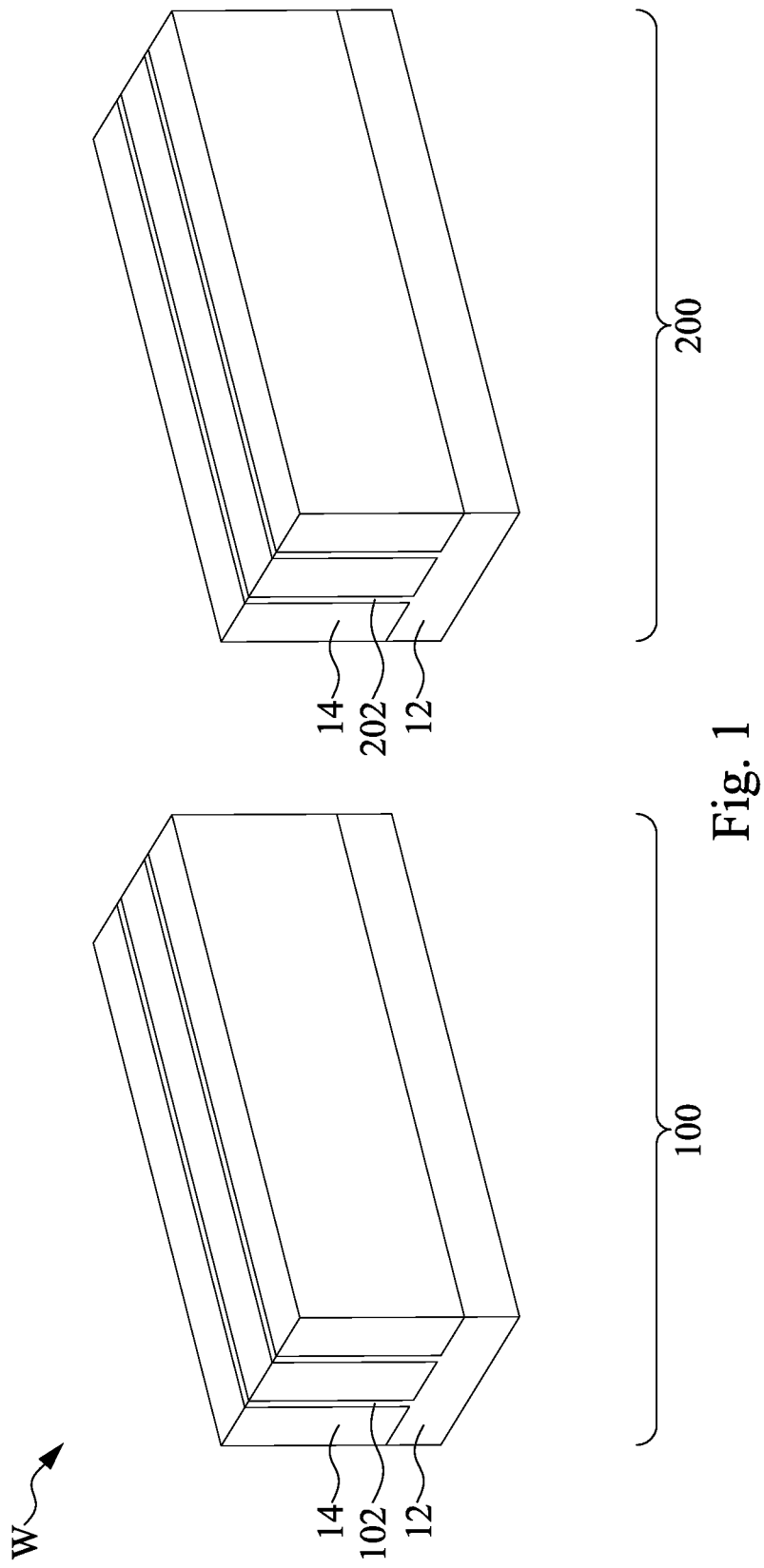
FIGS. 1, 2 and 3A illustrate perspective views of intermediate stages in the formation of transistors in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 through 17 illustrate the perspective views and cross-sectional views of intermediate stages in the formation of transistors in accordance with some embodiments of the present disclosure. The steps shown in FIGS. 1 through 17 are also reflected schematically in the process flow shown in FIGS. 18A and 18B. The formed transistors include a p-type transistor (such as a p-type FinFET) and an n-type transistor (such as an n-type FinFET) in accordance with some exemplary embodiments. Throughout the various views and illustrative embodiments, like reference numbers are used to designate like elements. It is understood that additional operations can be provided before, during, and after the processes shown by FIGS. 1-17, and some of the operations described below can be replaced or eliminated, for additional embodiments of the method. The order of the operations/processes may be interchangeable.

FIG. 1 illustrates a perspective view of an initial structure. The initial structure includes a wafer W, which further includes a substrate 12. The substrate 12 may be a semiconductor substrate, which may be a silicon substrate, a silicon germanium substrate, or a substrate formed of other semiconductor materials. In accordance with some embodiments of the present disclosure, the substrate 12 includes a bulk silicon substrate and an epitaxy silicon germanium (SiGe) layer or a germanium layer (without silicon therein) over the bulk silicon substrate. The substrate 12 may be doped with a p-type or an n-type impurity. Isolation regions 14 such as shallow trench isolation (STI) regions may be formed to extend into the substrate 12. The portions of substrate 12 between neighboring STI regions 14 are referred to as semiconductor strips 102 and 202, which are in first and second device regions 100 and 200, respectively. In some embodiments, the first device region 100 is an n-type transistor region, in which one or more n-type transistors such as one or more n-type FinFETs are to be formed, and the second device region 200 is a p-type transistor region, in which one or more p-type transistors such as one or more p-type FinFETs are to be formed. In some other embodiments, the first device region 100 is a p-type transistor region, in which one or more p-type transistors such as one or more p-type FinFETs are to be formed, and the second device region 200 is an n-type transistor region, in which one or more n-type transistors such as one or more n-type FinFETs are to be formed.

STI regions 14 may include a liner oxide (not shown) or silicon nitride layer or combination of both. The liner oxide may be formed of a thermal oxide formed through a thermal oxidation of a surface layer of substrate 12. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 14 may also include a dielectric material over the liner oxide, and the dielectric material may be formed using flowable chemical vapor deposition (FCVD), spin-on coating, or the like.

Figure 2:
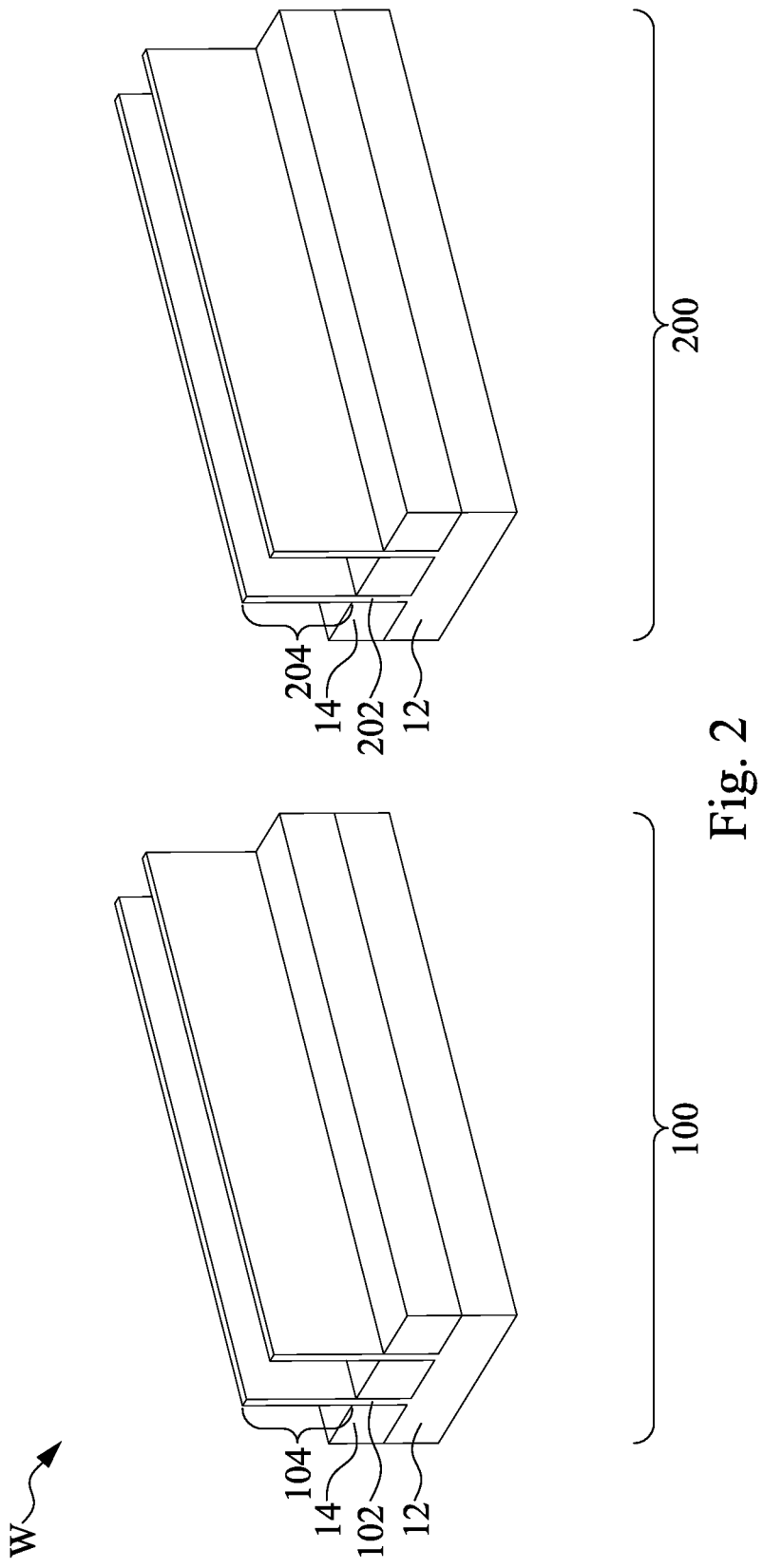

Referring to FIG. 2, the STI regions 14 are recessed, so that the top portions of semiconductor strips 102 and 202 protrude higher than the top surfaces of the neighboring STI regions 14 to form protruding fins 104 and 204. The respective step is illustrated as step S11 in the process flow shown in FIG. 18A. The etching may be performed using a dry etching process, wherein $NH_3$ and $NF_3$ are used as the etching gases. During the etching process, plasma may be generated. Argon may also be included. In accordance with alternative embodiments of the present disclosure, the recessing of the STI regions 14 is performed using a wet etch process. The etching chemical may include diluted HF, for example.

In above-illustrated exemplary embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The materials of protruding fins 104 and 204 may also be replaced with materials different from that of substrate 12. For example, protruding fins 104 may be formed of Si, SiP, SiC, SiPC, or a III-V compound semiconductor such as InP, GaAs, AlAs, InAs, InAlAs, InGaAs, or the like. Protruding fins 204 may be formed of Si, SiGe, SiGeB, Ge, or a III-V compound semiconductor such as InSb, GaSb, InGaSb, or the like.

Figure 3A:
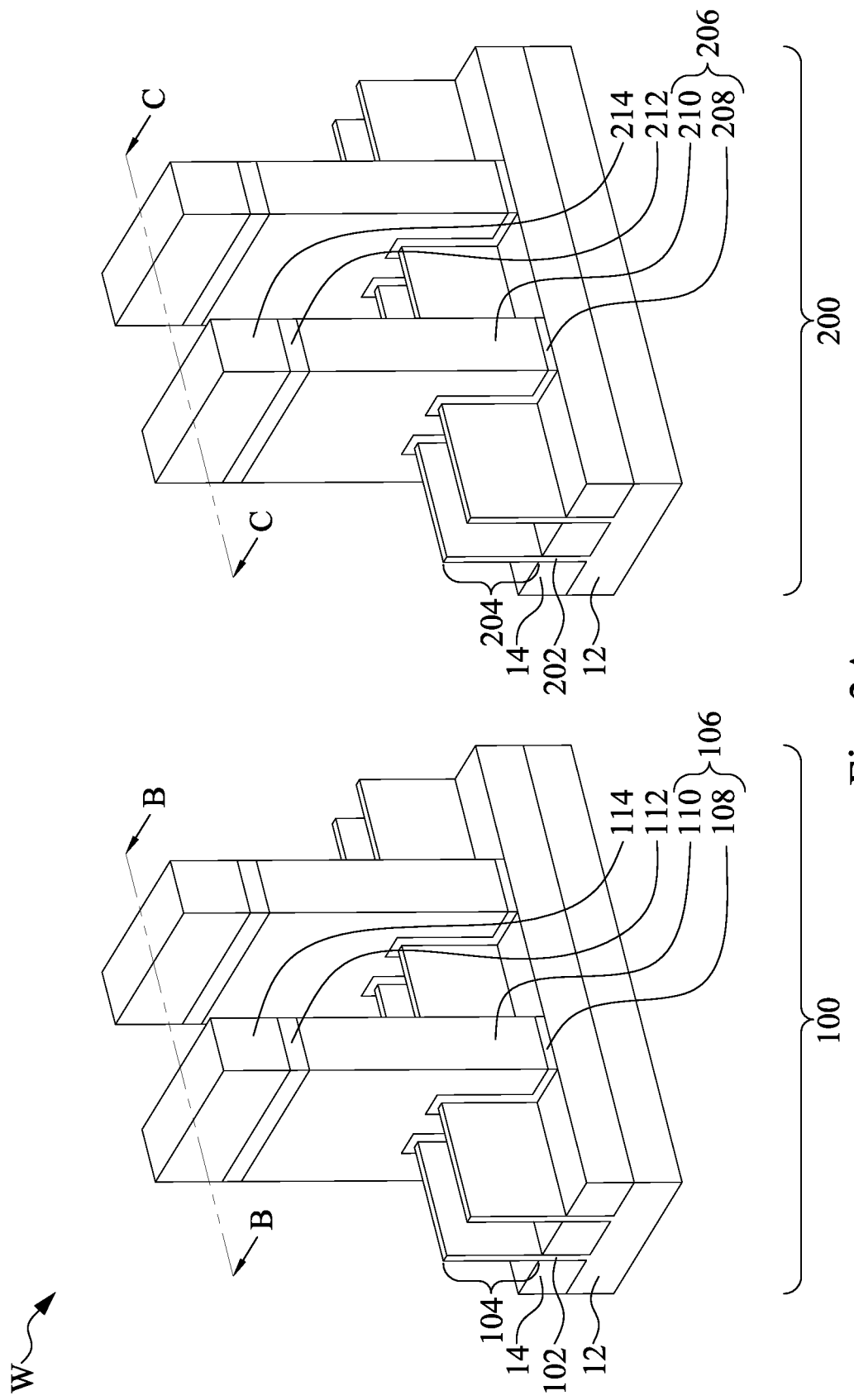

Referring to FIG. 3A, dummy gate stacks 106 and 206 are formed on the top surfaces and the sidewalls of protruding fins 104 and 204, respectively. The respective step is illustrated as step S12 in the process flow shown in FIG. 18A. Formation of the dummy gate stacks 106 and 206 includes depositing in sequence a gate dielectric layer and a dummy gate electrode layer across the fins 104 and 204, followed by patterning the gate dielectric layer and the dummy gate electrode layer. The resulting dummy gate stack 106 includes a gate dielectric layer 108 and a dummy gate electrode (interchangeably referred to as dummy gate structure) 110 over the gate dielectric layer 108. Similarly, the dummy gate stack 206 includes a gate dielectric layer 208 and a dummy gate electrode 210 over the dummy gate dielectric layer 208. The gate dielectric layers 108 and 208 can be any acceptable dielectric layer, such as silicon oxide, silicon nitride, the like, or a combination thereof, and may be formed using any acceptable process, such as thermal oxidation, a spin process, CVD, or the like. In some embodiments, the gate dielectric layers 108 and 208 may be interchangeably referred to as interfacial layers 108 and 208 that are respectively interfaced with the semiconductor fins 104 and 204. The dummy gate electrodes 110 and 210 can be any acceptable electrode layer, such as comprising polysilicon, metal, the like, or a combination thereof. The gate electrode layer can be deposited by any acceptable deposition process, such as CVD, plasma enhanced CVD (PECVD), or the like. Each of dummy gate stacks 106 and 206 crosses over a single one or a plurality of protruding fins 104 and 204, respectively. Dummy gate stacks 106 and 206 may have lengthwise directions perpendicular to the lengthwise directions of the respective protruding fins 104 and 204, respectively.

A mask pattern may be formed over the dummy gate electrode layer to aid in the patterning. In some embodiments, a hard mask pattern including bottom masks 112 and 212 over a blanket layer of polysilicon and top masks 114 and 214 over the respective bottom masks 112 and 212. The hard mask pattern is made of one or more layers of $SiO_2$, SiCN, SiON, $Al_2O_3$, SiN, or other suitable materials. In certain embodiments, the bottom masks 112 and 212 include silicon nitride, and the top masks 114 and 214 includes silicon oxide. By using the mask pattern as an etching mask, the dummy electrode layer is patterned into the dummy gate electrodes 110 and 210, and the blanket gate dielectric layer is patterned into the gate dielectric layers 108 and 208.

Figure 3B:
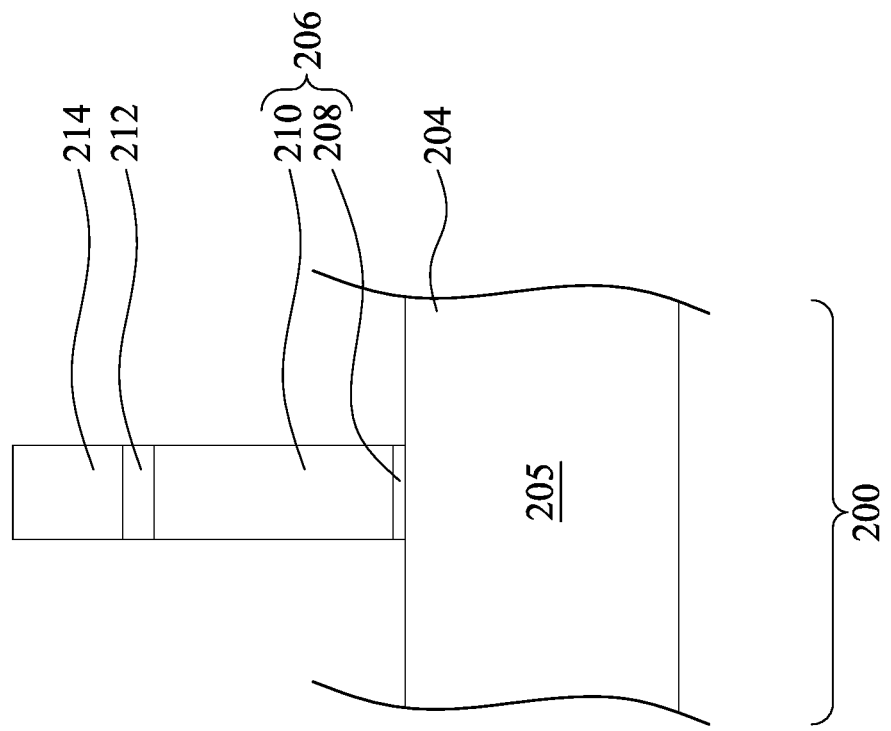
Figure 3B:
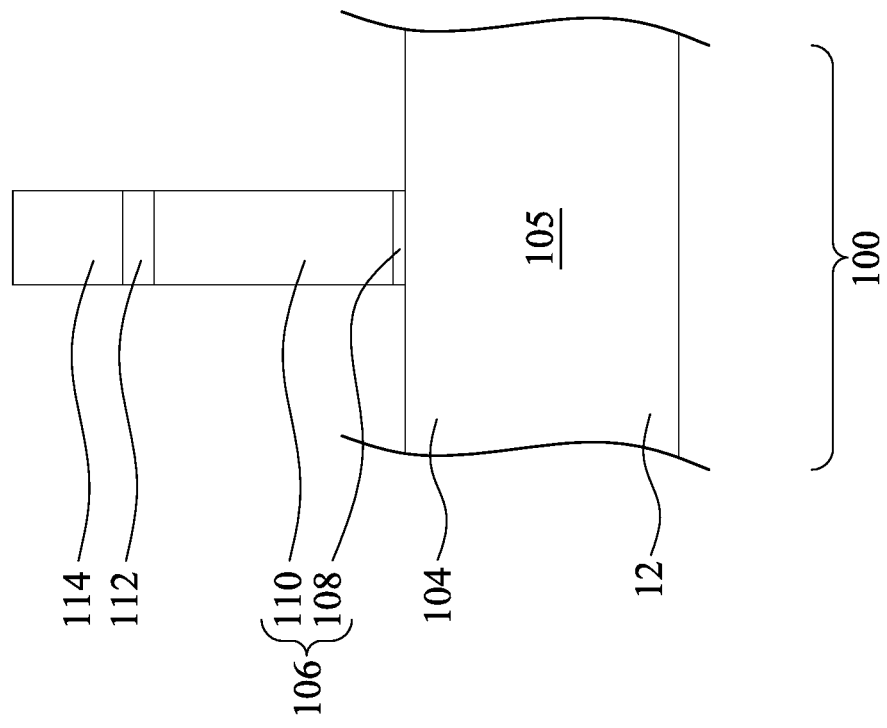

FIG. 3B illustrates a cross-sectional view of device regions 100 and 200 in accordance with some embodiments. The cross-sectional view combines the cross-sectional view obtained from the vertical plane containing line B-B in FIG. 3A and the cross-sectional view obtained from the vertical plane containing line C-C in FIG. 3A, with one or more STI regions 14 separating first and second device regions 100 and 200. Protruding fins 104 and 204 are illustrated schematically. Also, a first well region 105 and a second well region 205 may be formed to extend into protruding fins 104 and 204, respectively. In some embodiments where the first device region 100 is an NFET region and the second device region 200 is a PFET region, the first well region 105 in the first device region 100 is a p-well region, and the second well region 205 is an n-well region. In some embodiments where the first device region 100 is a PFET region and the second device region 200 is an NFET region, the first well region 105 in the first device region 100 is an n-well region, and the second well region 205 is a p-well region. The first well region 105 and the second well region 205 may also extend into the bulk portion of semiconductor substrate 12 lower than protruding fins 104 and 204. Unless specified otherwise, the cross-sectional views in subsequent figures may also be obtained from planes same as the vertical planes as shown in FIG. 3A, which planes contain lines B-B and C-C, respectively.

Figure 4:
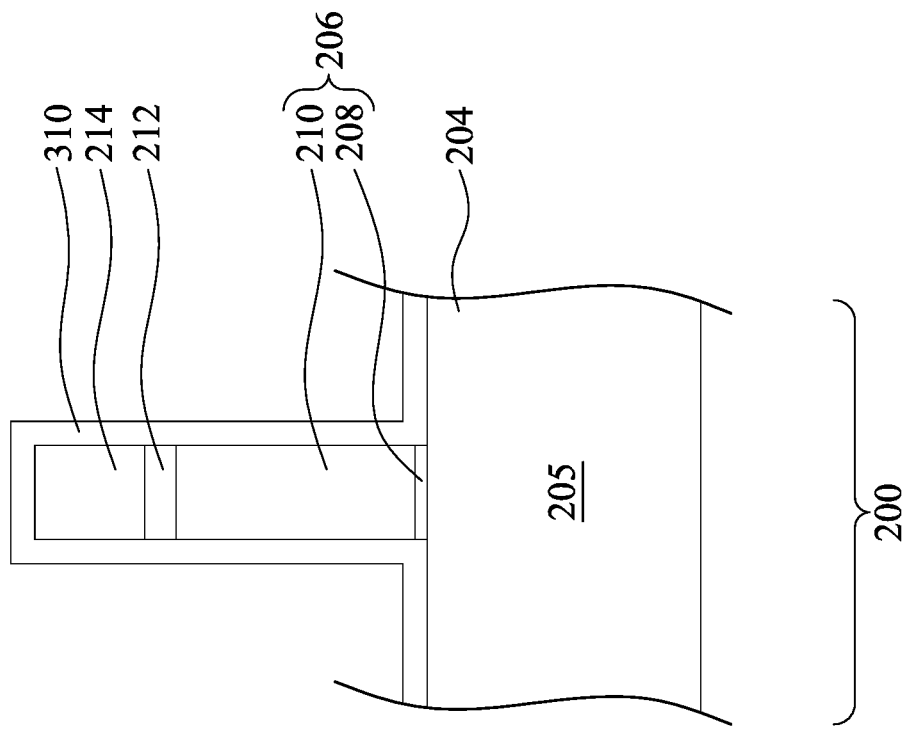
Figure 4:
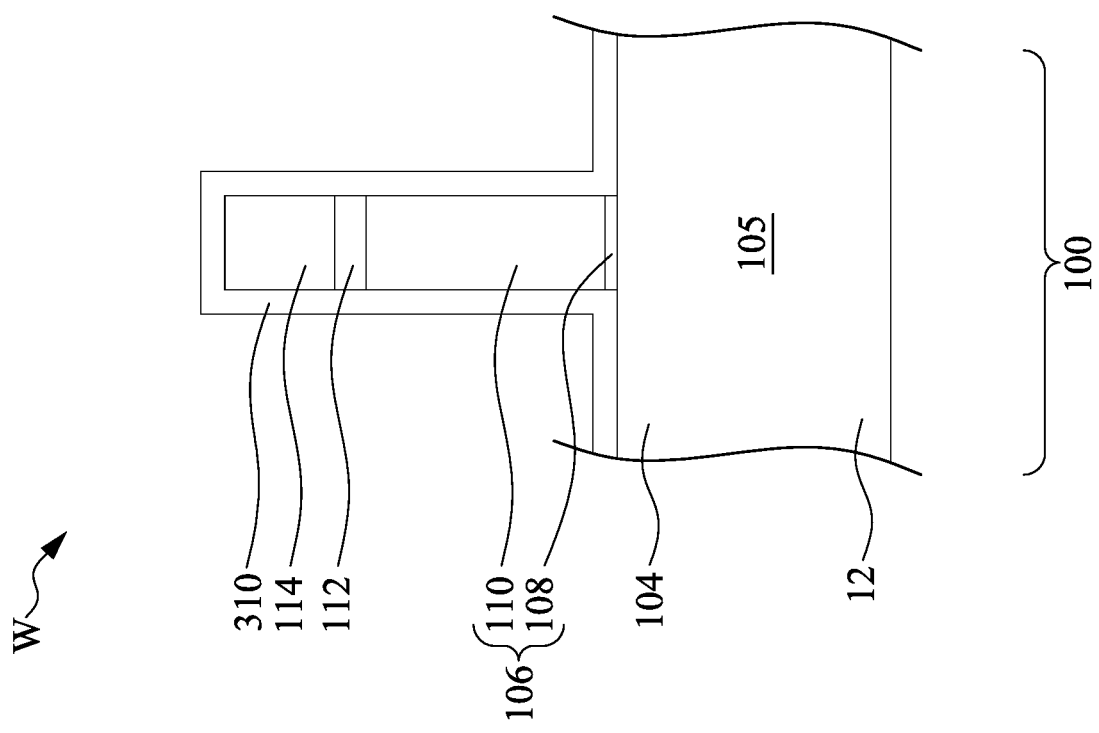

Next, as shown in FIG. 4, a first spacer layer 310 is formed as a blanket layer to cover the wafer W. The respective step is also illustrated as step S13 in the process flow shown in FIG. 18A. In some embodiments, the first spacer layer 310 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials, or other suitable dielectric materials. The first spacer layer 310 may be formed using, for example, CVD, ALD, PVD or other suitable deposition techniques. As a result of the blanket deposition, the first spacer layer 310 includes different portions respectively in the first and second device regions 100 and 200.

Figure 5:
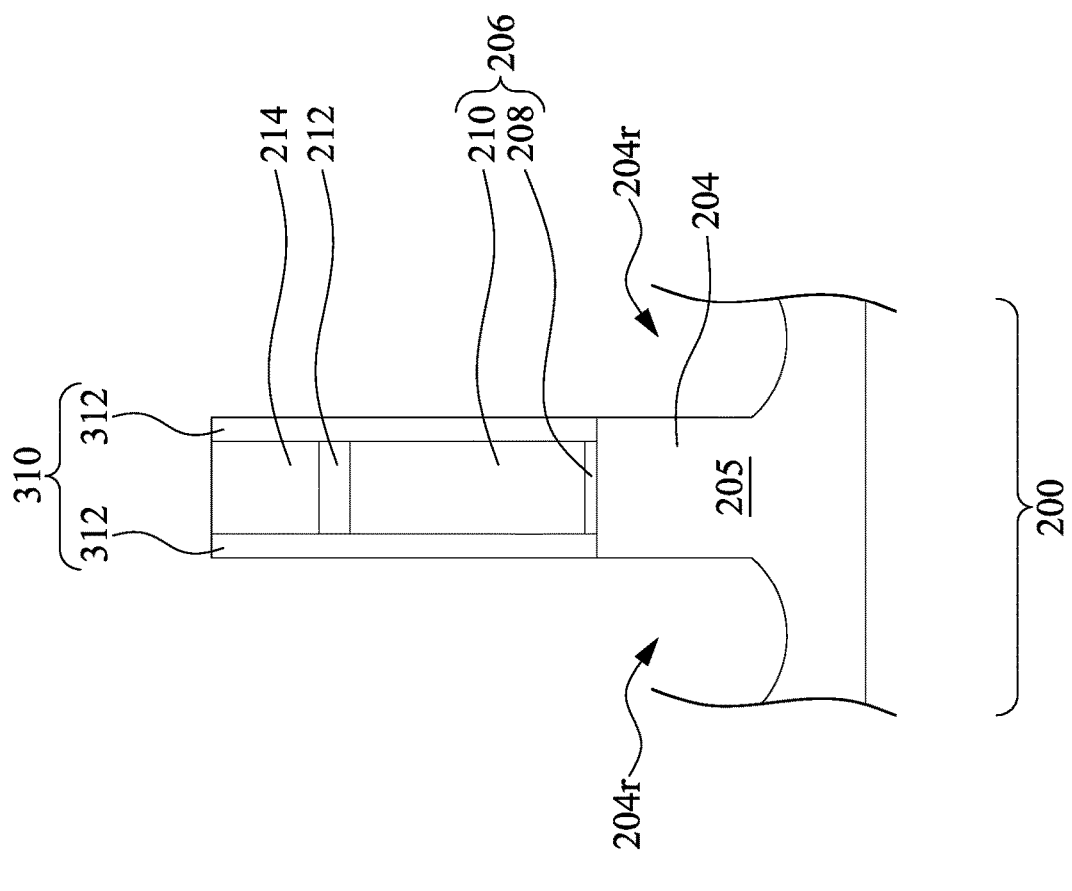
Figure 5:
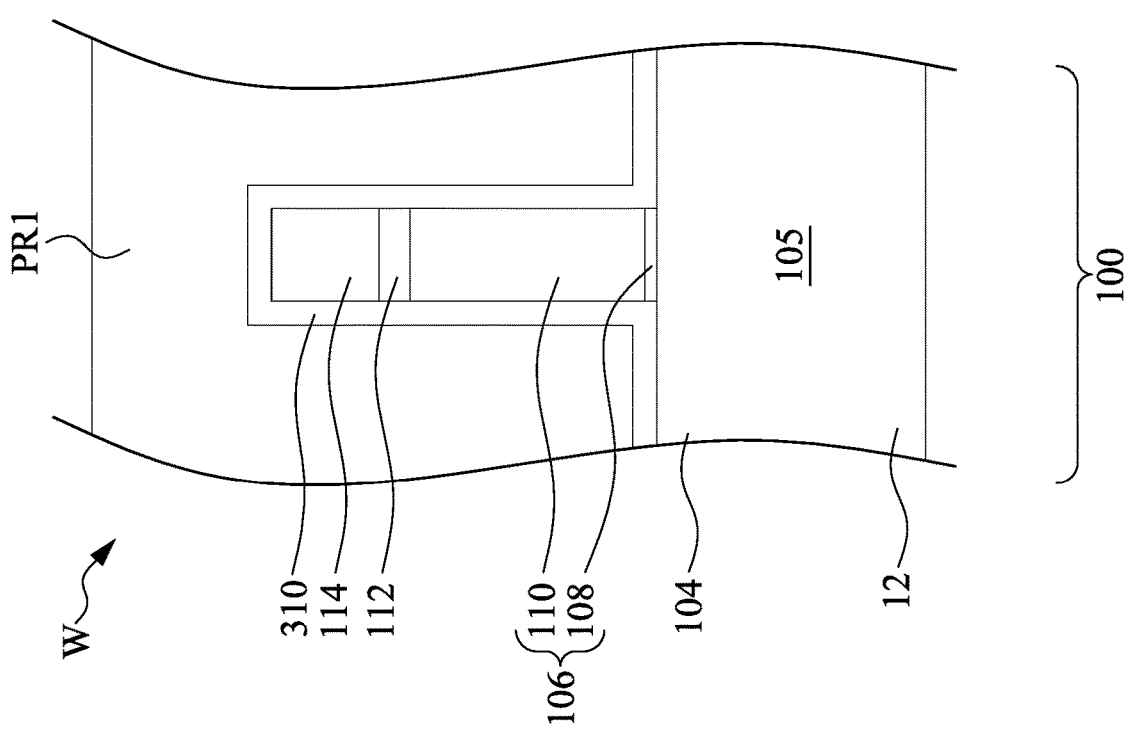

FIG. 5 illustrates patterning of the first spacer layer 310 in the second region 200. First, a photoresist mask PR1 (e.g., a single-layer photoresist or a tri-layer photoresist) is applied and patterned to cover the first device region 100 and leaves the second region 200 uncovered. Next, an anisotropic etching process is performed to etch the first spacer layer 310 in the uncovered second device region 200, so that horizontal portions of the first spacer layer 310 are removed, exposing at least a top surface of the semiconductor fin 204. The respective step is illustrated as step S14 in the process flow shown in FIG. 18A. The remaining portions 312 of the first spacer layer 310 on sidewalls of the dummy gate stack 206 can be interchangeably referred to inner spacers 312.

In a subsequent step, the exposed semiconductor fin 204 is recessed, for example, in an anisotropic or isotropic etching step, so that recesses 204r are formed to extend into the semiconductor fin 204. The respective step is illustrated as step S15 in the process flow shown in FIG. 18A. The etching is performed using an etchant that attacks the semiconductor fin 204, and hardly attacks the inner spacers 312. Stated differently, the inner spacers 312 have higher etch resistance to the etching process than that of the semiconductor fin 204. Accordingly, in the etching step, the heights of the inner spacers 312 are substantially not reduced, and an outer sidewall profile of the inner spacers 312 also remains substantially unchanged during the etching step.

In some embodiments, recessing the semiconductor fin 204 may be performed by a dry chemical etch with a plasma source and an etchant gas. The plasma source may be inductively coupled plasma (ICR) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the semiconductor fin 204 at a faster etch rate than it etches the inner spacers 312. In some other embodiments, recessing the semiconductor fin 204 may be performed by a wet chemical etch, such as ammonium peroxide mixture (APM), $NH_4OH$, tetramethylammonium hydroxide (TMAH), combinations thereof, or the like, which etches the semiconductor fin 204 at a faster etch rate than it etches the inner spacers 312. In some other embodiments, recessing the semiconductor fin 204 may be performed by a combination of a dry chemical etch and a wet chemical etch. In some embodiments, after the formation of recesses 204r, the photoresist mask PR1 is removed, for example, in an ashing step, such as using oxygen plasma.

Figure 6:
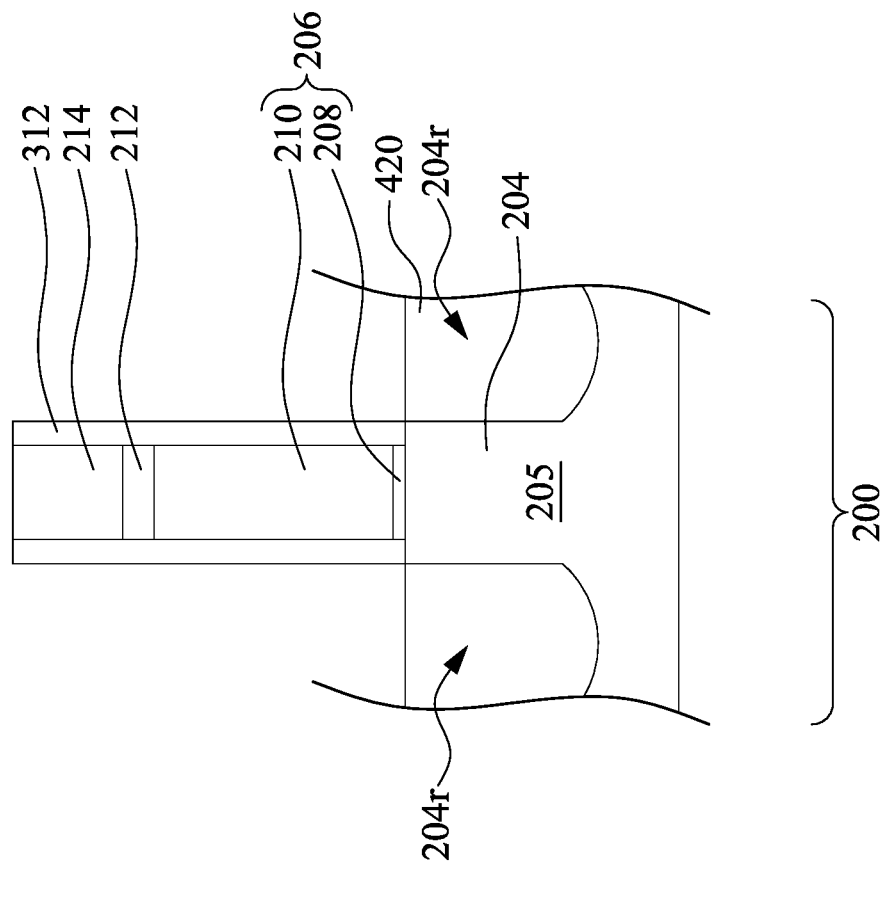
Figure 6:
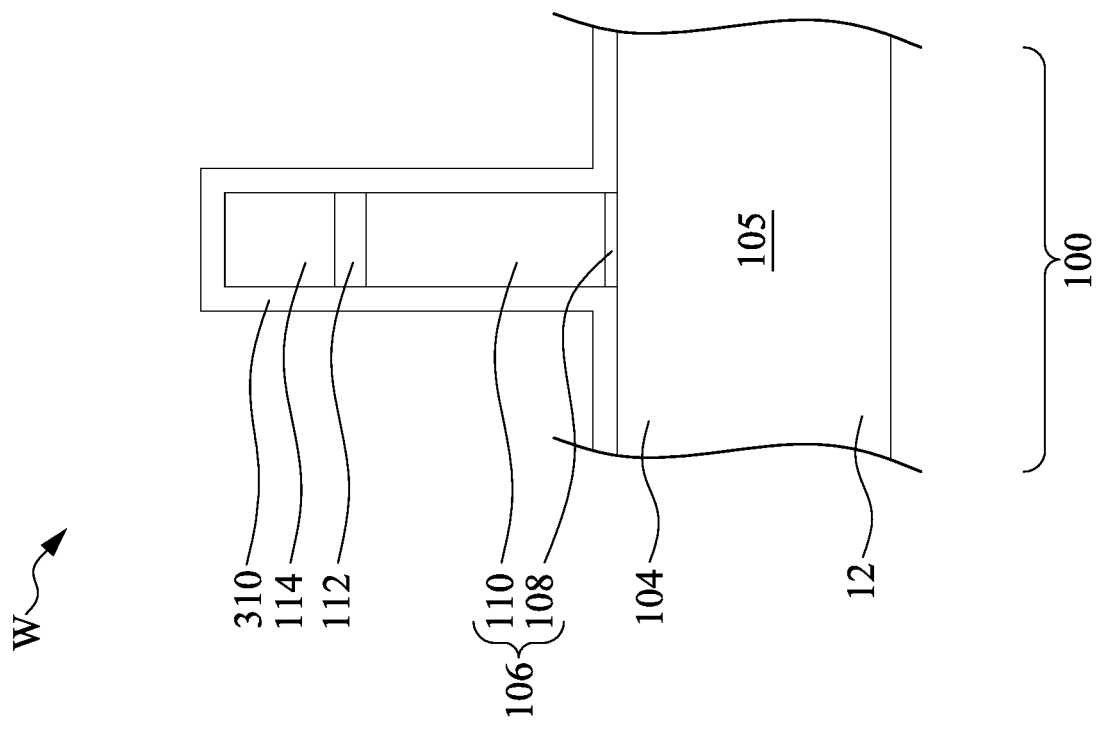

FIG. 6 illustrates epitaxy for forming epitaxy structures 420 in the second device region 200. In accordance with some embodiments of the present disclosure, the epitaxy structures 420 may be formed using one or more epitaxy or epitaxial (epi) processes, such that Si, SiGe, SiGeB, Ge or a III-V compound semiconductor such as InSb, GaSb, InGaSb, or the like can be grown in the recesses 204r in the semiconductor fin 204. The respective step is illustrated as step S16 in the process flow shown in FIG. 18A. In some embodiments, a p-type impurity (e.g., boron) may be in-situ doped in the epitaxy structures 420, so that the resulting FinFETs formed in the second device region 200 are p-type FinFETs, and the second device region 200 can be referred to as a PFET region in these embodiments. In some embodiments, the lattice constants of the epitaxy structures 420 are different from the lattice constant of the semiconductor fin 204, so that the channel region in the fin 204 and between the epitaxy structures 420 can be strained or stressed by the epitaxy structures 420 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 204.

It is noted that the photoresist PR1 is removed from the first device region 100 before the epitaxy process. This order may be advantageous for reducing impacts resulting from performing an epitaxy process on a photoresist-coated wafer. By way of example, if the photoresist PR1 (as shown in FIG. 5) remains covering the first device region 100 during the epitaxy process, the epitaxy process (e.g., plasmas in the PECVD process) might cause damages to the photoresist PR1. Such damages might lead to increased photoresist scums (or residues) on the first device region 100 after the photoresist ashing process. However, because the photoresist PR1 is removed prior to epitaxially growing the epitaxy structures 420, the photoresist scums in the first device region 100 can be reduced.

Figure 7:
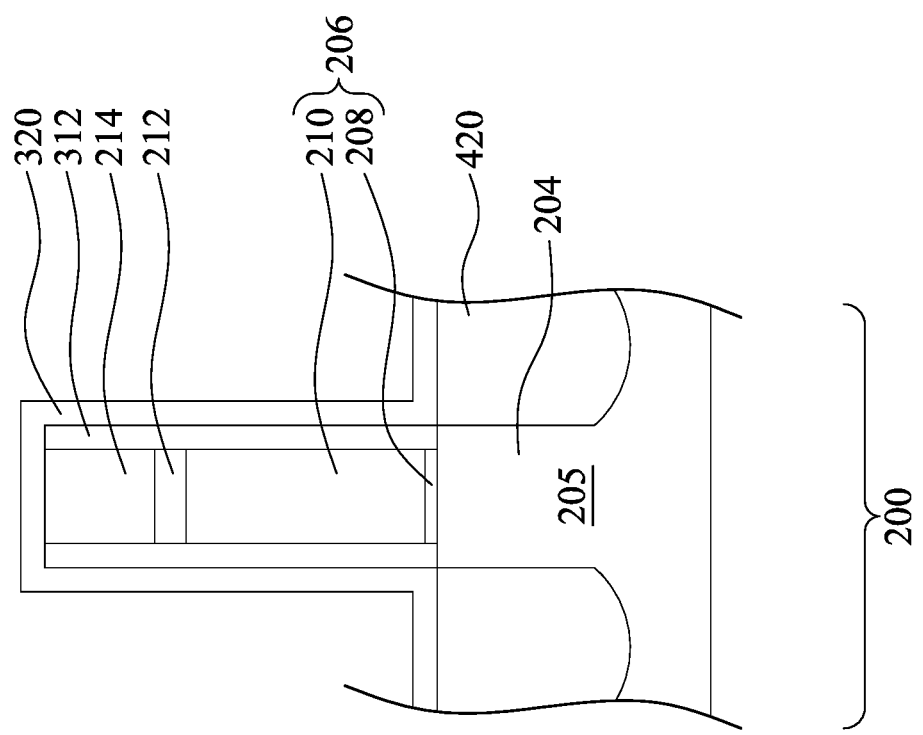
Figure 7:
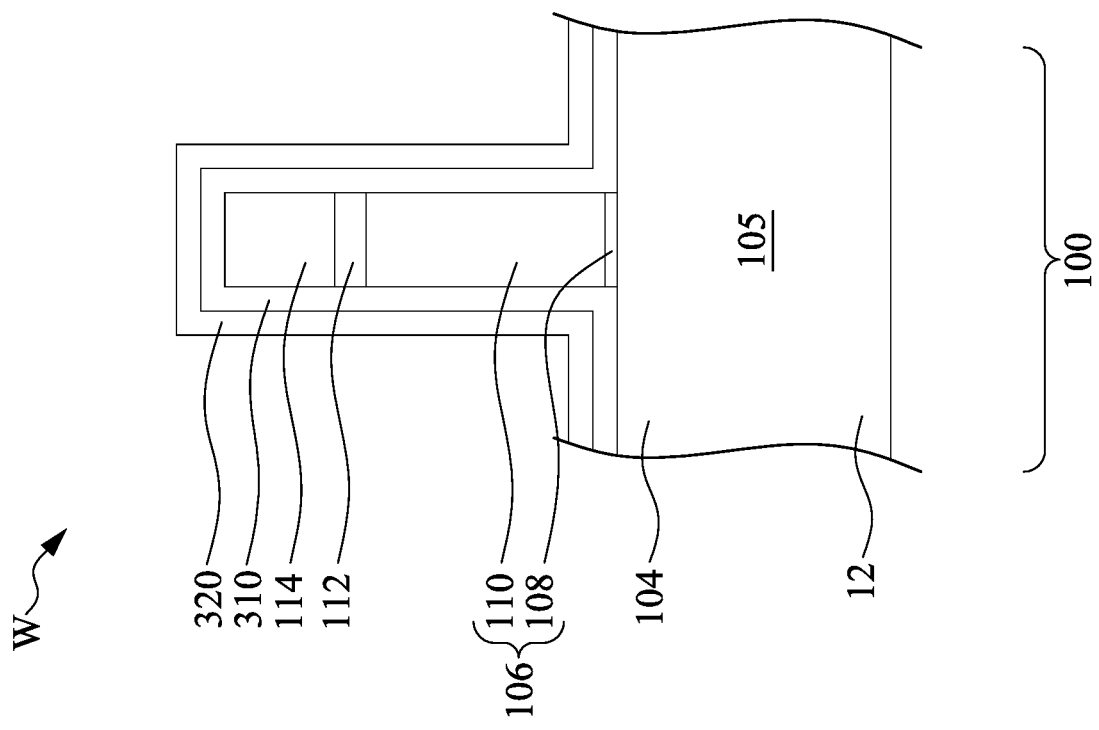

Next, as shown in FIG. 7, a second spacer layer 320 is formed as a blanket layer to cover the wafer W. The respective step is also illustrated as step S17 in the process flow shown in FIG. 18A. In some embodiments, the second spacer layer 320 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials, or other suitable dielectric materials. In some embodiments, the second spacer layer 320 may include the same material as the first spacer layer 310. Alternatively, the second spacer layer 320 may include a different material than the first spacer layer 310. The second spacer layer 320 may be formed using, for example, CVD, ALD, PVD or other suitable deposition techniques. As a result of the blanket deposition, the second spacer layer 320 includes different portions respectively in the first and second device regions 100 and 200.

Figure 8:
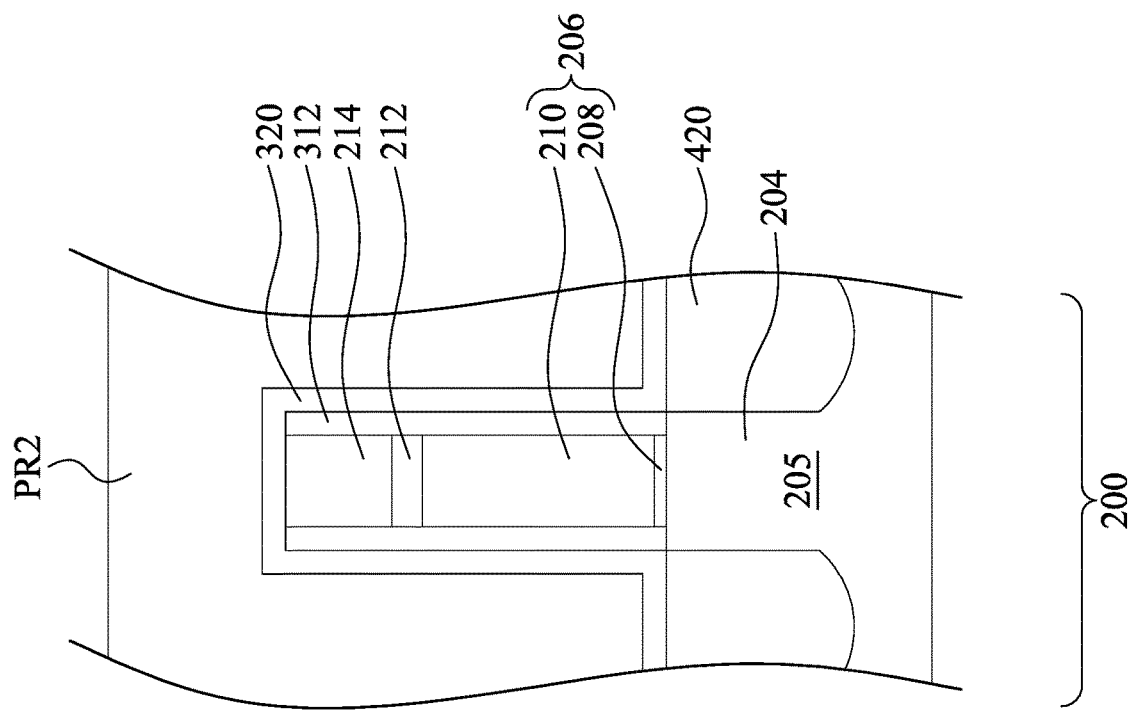
Figure 8:
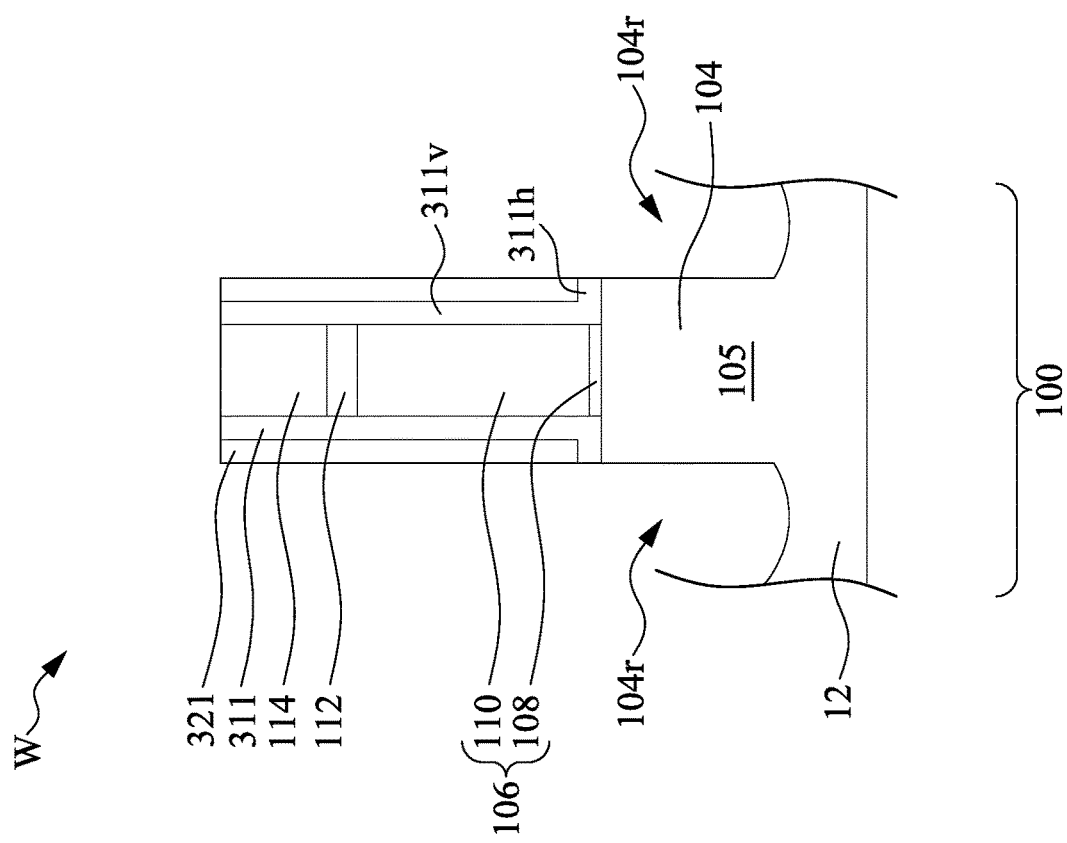

FIG. 8 illustrates patterning of the second spacer layer 320 in the first device region 100. First, a photoresist mask PR2 (e.g., a single-layer photoresist or a tri-layer photoresist) is applied and patterned to cover the second device region 200 and leaves the first device region 100 uncovered. Next, an anisotropic etching process is performed to etch the first and second spacer layers 310 and 320 in the uncovered first device region 100, so that horizontal portions of the first and second spacer layers 310 and 320 are removed, exposing at least a top surface of the semiconductor fin 104. The respective step is illustrated as step S18 in the process flow shown in FIG. 18A. The remaining portions 311 of the first spacer layer 310 on sidewalls of the dummy gate stack 106 can be interchangeably referred to inner spacers 311, and the remaining portions 321 of the second spacer layer 320 on sidewalls of the inner spacers 311 can be interchangeably referred to as outer spacers 321.

As a result of the patterning, the inner spacer 311 has a substantially L-shaped cross section and thus has a substantially horizontal portion 311h extending along the top surface of the semiconductor fin 104 and a substantially vertical portion 311v extending along the sidewall of the dummy gate stack 106. The outer spacer 321 has a different cross section profile than the inner spacer 311. For example, the outer spacer 321 has a substantially linear-shaped cross section, rather than an L-shaped cross section. In greater detail, the outer spacer 321 has a bottom surface in contact with a top surface of the horizontal portion 311h of the inner spacer 311 and a sidewall in contact with a sidewall of the vertical portion 311v of the inner spacer 311. Therefore, in some embodiments, the inner spacer 311 and the outer spacer 321 may form an interface having an L-shaped cross section.

In a subsequent step, the exposed semiconductor fin 104 is recessed, for example, in an anisotropic or isotropic etching step, so that recesses 104r are formed to extend into the semiconductor fin 104. The respective step is illustrated as step S19 in the process flow shown in FIG. 18B. The etching is performed using an etchant that attacks the semiconductor fin 104, and hardly attacks the inner and outer spacers 311 and 321. Stated differently, the inner and outer spacers 311 and 321 have higher etch resistance to the etching process than that of the semiconductor fin 104. Accordingly, in the etching step, the heights of the inner and outer spacers 311 and 321 are substantially not reduced, and an outer sidewall profile of the outer spacers 321 also remains substantially unchanged during the etching step.

In some embodiments, recessing the first semiconductor fin 104 may be performed by an etching process using the same etchant as that used in recessing the second semiconductor fin 204, as discussed previously with respect to the etch operation as illustrated in FIG. 5. Therefore, example etchants are not repeated herein for the sake of brevity. In some embodiments, after the formation of recesses 104r, the photoresist mask PR2 is removed, for example, in an ashing step, such as using oxygen plasma.

Figure 9:
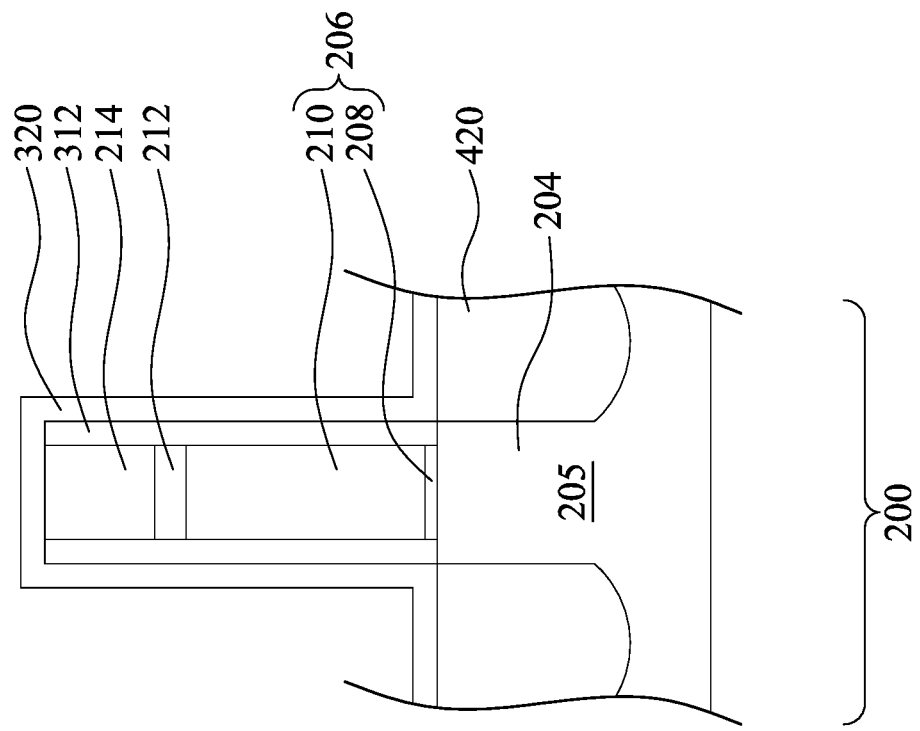
Figure 9:
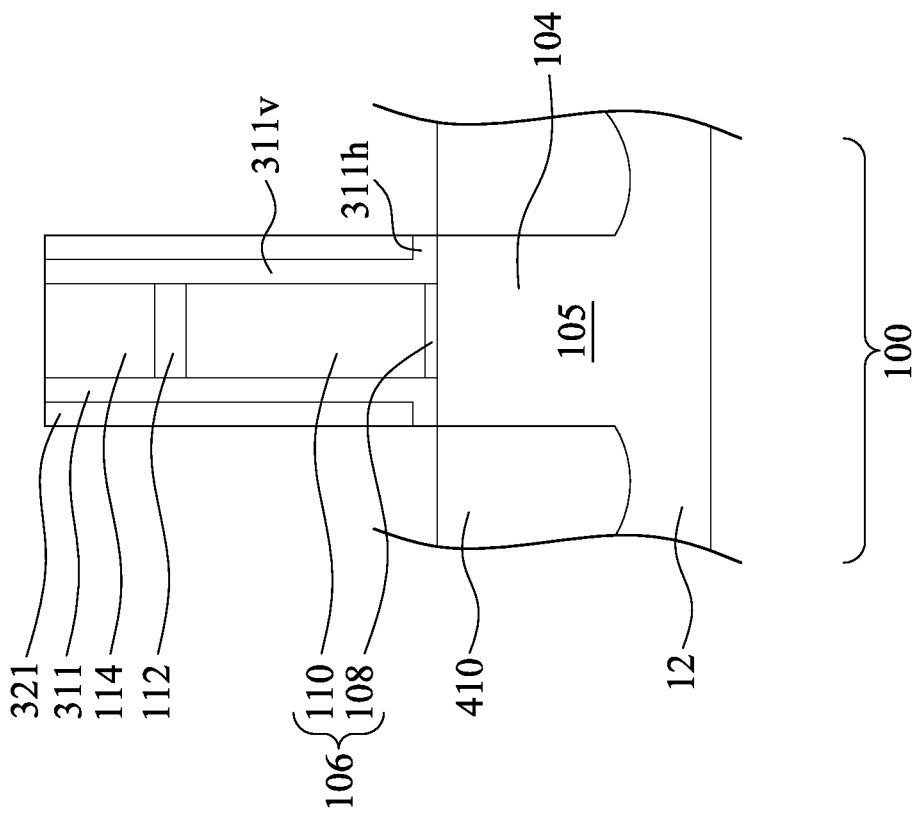

FIG. 9 illustrates epitaxy for forming epitaxy structures 410 in the first device region 100. In accordance with some embodiments of the present disclosure, the epitaxy structures 410 may be in-situ doped with an n-type impurity (e.g., phosphorus), so that the resulting FinFETs formed in the first device region 100 are n-type FinFETs, and the first device region 100 can be referred to as an NFET region. The respective step is illustrated as step S20 in the process flow shown in FIG. 18B. In some embodiments, the epitaxy structures 410 may include Si, SiP, SiC, SiPC, SiAs, or a III-V compound semiconductor such as InP, GaAs, AlAs, InAs, InAlAs, InGaAs, or the like. In some embodiments, the lattice constants of the epitaxy structures 410 are different from the lattice constant of the semiconductor fin 104, so that the channel region in the fin 104 and between the epitaxy structures 410 can be strained or stressed by the epitaxy structures 410 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 104.

It is noted that the photoresist PR2 is removed from the second device region 200 before the epitaxy process. This order may be advantageous for reducing impacts resulting from performing an epitaxy process on a photoresist-coated wafer. By way of example, if the photoresist PR2 (as shown in FIG. 8) remains covering the second device region 200 during the epitaxy process, the epitaxy process (e.g., plasmas in the PECVD process) might cause damages to the photoresist PR2. Such damages might lead to increased photoresist scums (or residues) on the second device region 200 after the photoresist ashing process. However, because the photoresist PR2 is removed prior to epitaxially growing the epitaxy structures 410, the photoresist scums in the second region 200 can be reduced.

Moreover, although the photoresist PR2 is removed from the second device region 200, the epitaxy structures 420 (e.g., p-type epitaxy structures) are still covered by the second spacer layer 320. Therefore, the second spacer layer 320 in the second device region 200 may prevent n-type epitaxy materials from epitaxially growing on the p-type epitaxy structures 420.

Figure 18A:
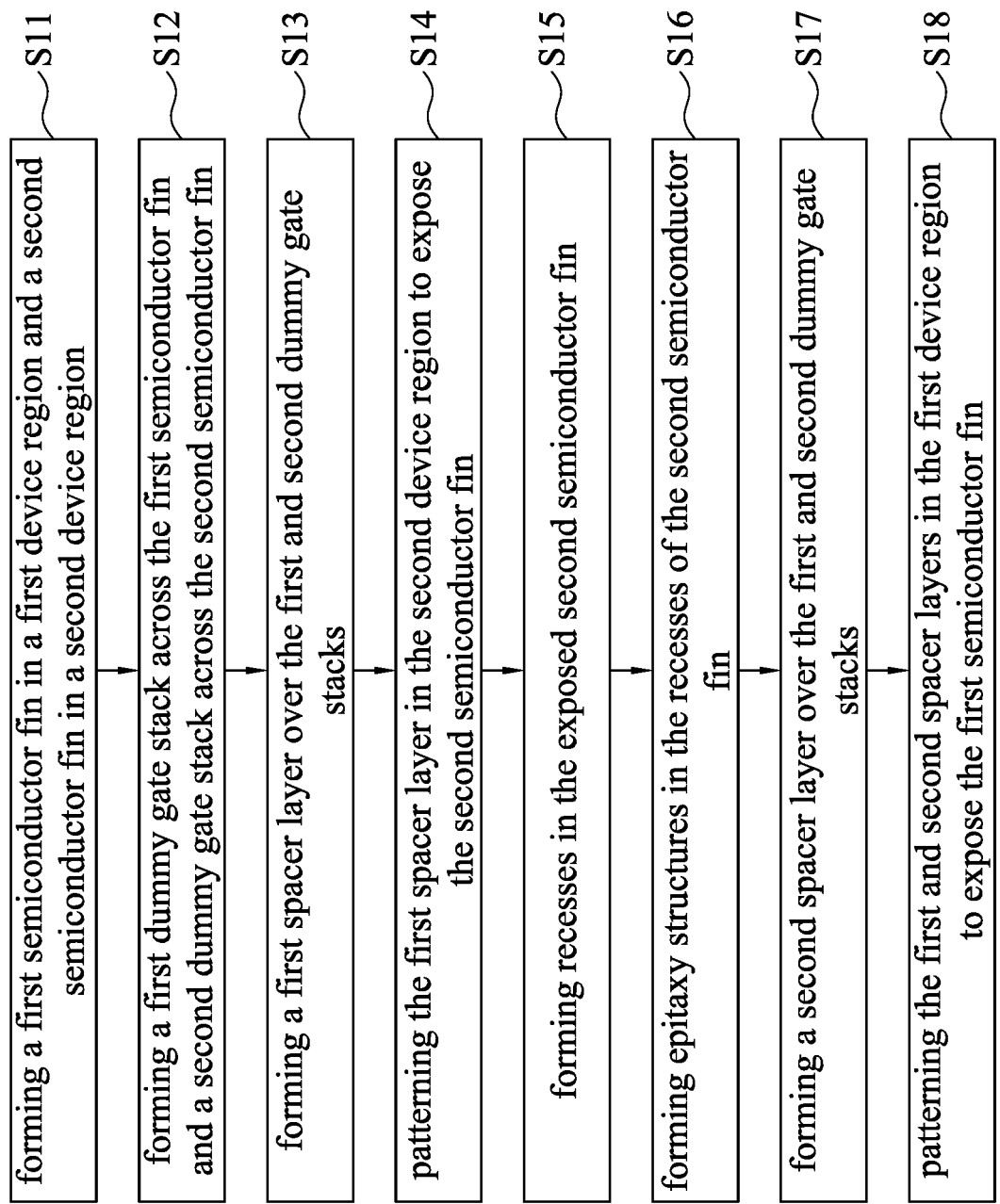
FIGS. 18A and 18B illustrate a flow chart of a process for forming transistors in accordance with some embodiments.
Figure 18B:

Although the process flow as shown in FIGS. 18A and 18B involves forming the p-type epitaxy structures first (i.e., step S16) followed by forming the n-type epitaxy structures (i.e., step S20), some other embodiments of the present disclosure may use a reverse order. In greater detail, n-type epitaxy structures can be formed first in the second device region 200 at the step as illustrated in FIG. 6, followed by forming p-type epitaxy structures in the first device region 100 at the step as illustrated in FIG. 9. In such embodiments, the epitaxy structures 410 formed in the first device region 100 are p-type epitaxy structures and thus the first device region 100 can be referred to as a PFET region, and the epitaxy structures 420 formed in the second device region 200 are n-type epitaxy structures and thus the second device region 200 can be referred to as an NFET region.

Figure 10:
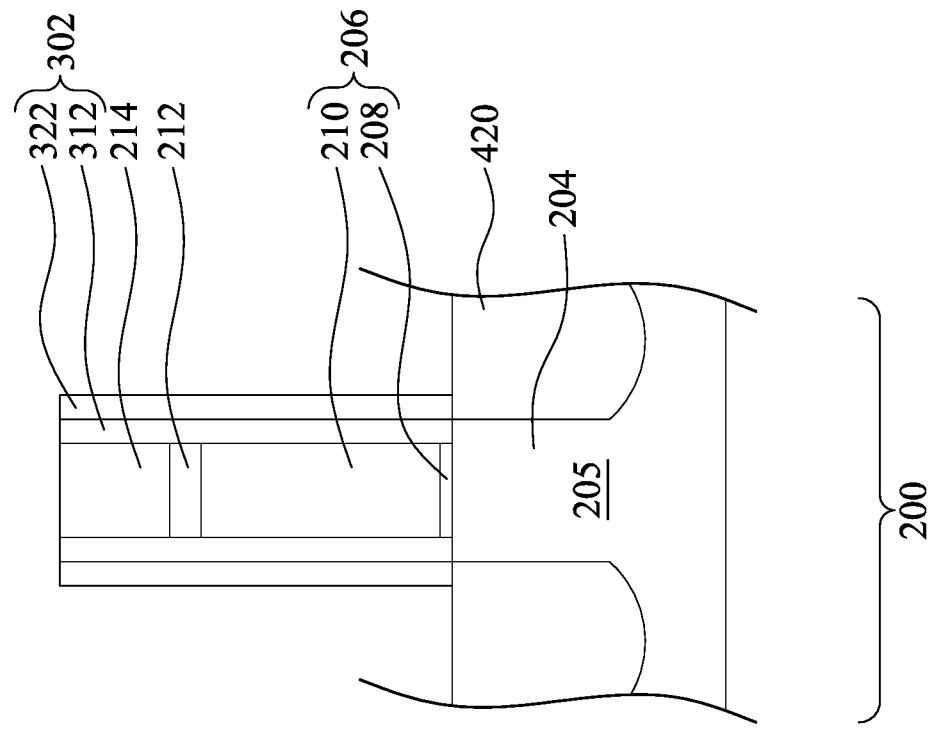
Figure 10:
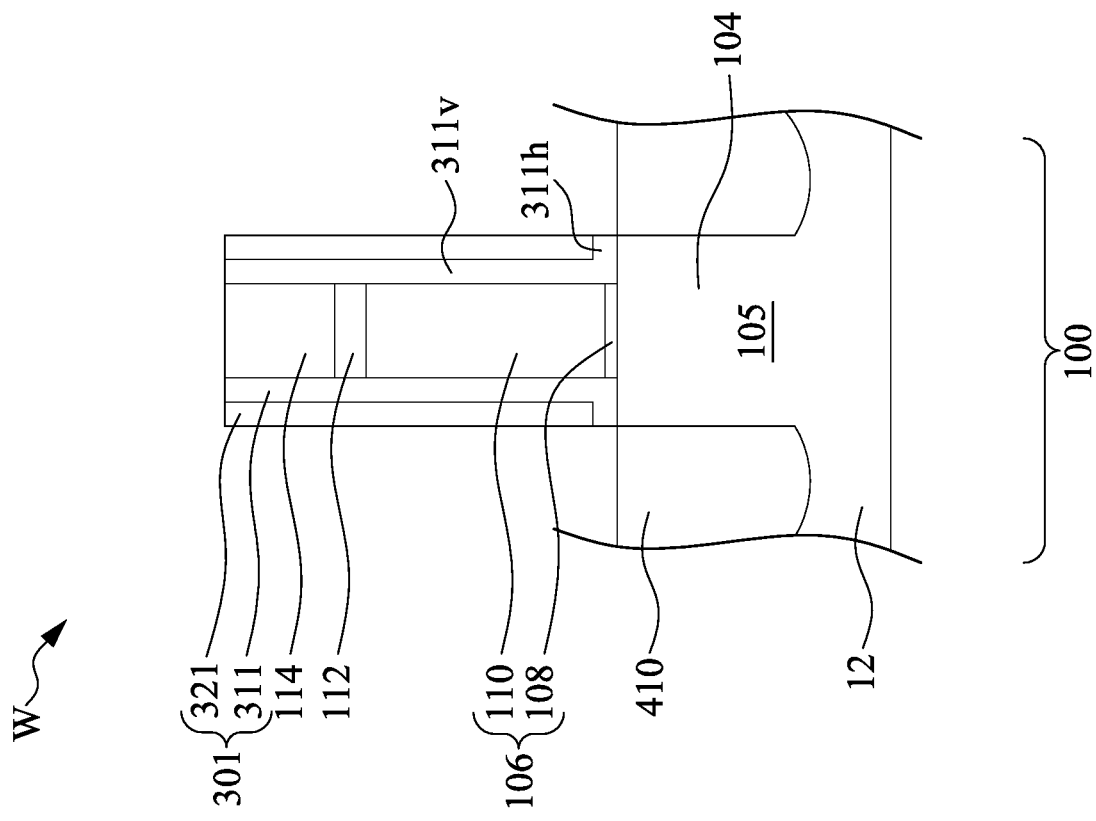

FIG. 10 illustrates patterning of the second spacer layer 320 in the second device region 200. In some embodiments, an anisotropic etching process is performed to etch the second spacer layer 320, so that horizontal portions of the second spacer layer 320 are removed, exposing at least top surfaces of the epitaxy structures 420. The respective step is illustrated as step S21 in the process flow shown in FIG. 18B. The remaining portions 322 of the second spacer layer 320 on sidewalls of the inner spacers 312 and over the epitaxy structures 420 can be interchangeably referred to outer spacers 322. The inner and outer spacers 311 and 321 in the first device region 100 can be in combination referred to as gate spacers 301 alongside the dummy gate stacks 106, and the inner and outer spacers 312 and 322 in the first device region 200 can be in combination referred to as gate spacers 302 alongside the dummy gate stacks 206.

The outer spacers 322 have substantially the same cross section profile as the inner spacers 312. For example, the inner and outer spacers 312 and 322 have a liner-shaped cross section parallel with the sidewall of the dummy gate stack 206. Therefore, the inner and outer spacers 312 and 322 may form an interface having a linear-shaped cross section. On the contrary, the inner and outer spacers 311 and 321 in the first device region 100 have different cross section profiles and form an interface having an L-shaped cross section, as discussed previously with respect to FIG. 8. Therefore, the gate spacer 301 in the first device region 100 may have an inner interface with a different cross section profile than an inner interface of the gate spacer 302 in the second device region 200. Such a difference may be evidence that a process flow similar to steps S13-S21 in the process flow shown in FIGS. 18A and 18B is used to fabricate the semiconductor device.

Figure 11:
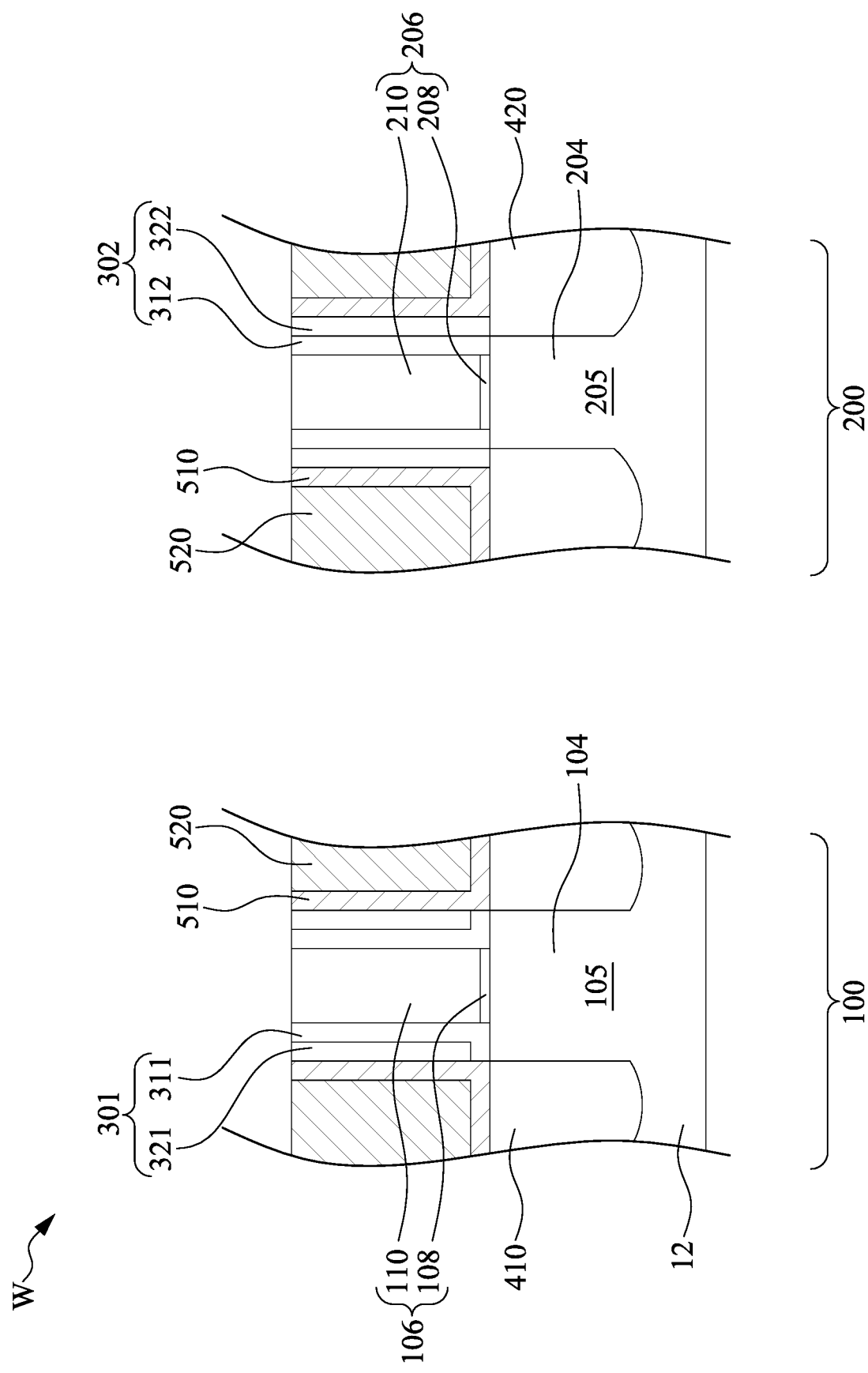

Thereafter, as shown in FIG. 11, a contact etch stop layer (CESL) 510 and an interlayer dielectric (ILD) layer 520 is formed in sequence over the wafer W, followed by a CMP process performed to remove excessive material of the CESL 510 and the ILD layer 520 to expose the dummy gate electrodes 110 and 210. The respective step is illustrated as step S22 in the process flow shown in FIG. 18B. The CMP process may remove masks 112, 114, 212 and 214 (as shown in FIG. 10) and planarize a top surface of the ILD layer 520 with top surfaces of the dummy gate stacks 106, 206, of the inner spacers 311, 312, of the outer spacers 321, 322, and of the CESL 510. In some embodiments, the CESL 510 is made of a silicon nitride based material, such as SiN, SiON or the like, and is formed using suitable deposition techniques, such as CVD, ALD, PVD or the like. The ILD layer 520 is made of a different material than the CESL 510, so that the CESL 510 can slow down a contact etch process performed on the ILD layer 520. For example, the ILD layer 520 includes silicon oxide, phosphosilicate glass (PSG), borophosphosilicate glass (BPSG), low-k dielectric materials, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 520 may be formed using, for example, CVD, ALD, spin-on-glass (SOG) or other suitable techniques.

Figure 12:
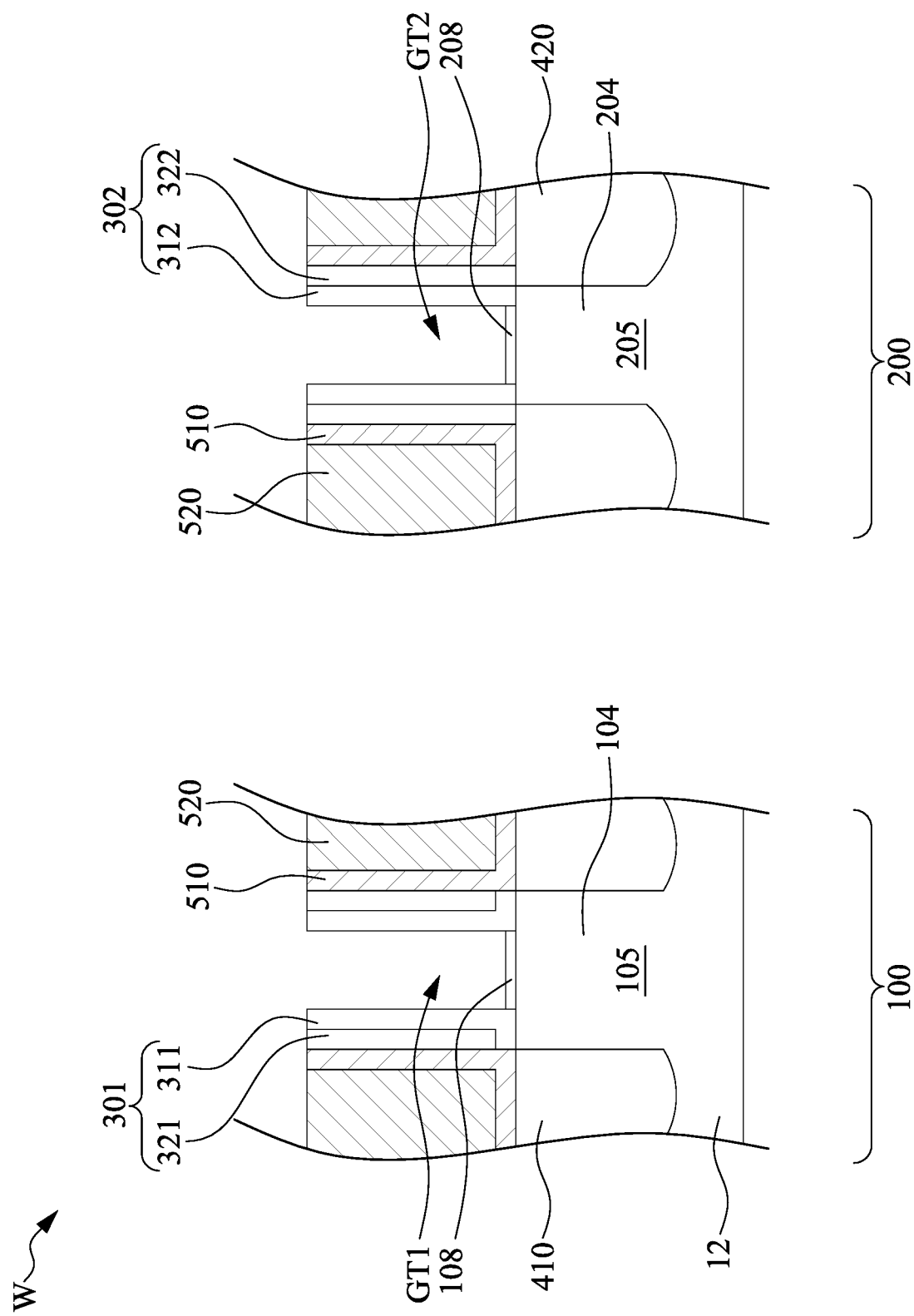

Next, the dummy gate electrodes 110 and 120 are removed, thereby forming a gate trench GT1 between the inner spacers 311 in the first device region 100 and a gate trench GT2 between the inner spacers 312 in the second device region 200. The resultant structure is shown in FIG. 12, and the respective step is illustrated as step S23 in the process flow shown in FIG. 18B. The dummy gate electrodes 110 and 210 may be removed using a selective etching process that etches the dummy gate electrodes 110 and 210 at a faster etch rate than it etches other materials on the wafer W. For example, if the dummy gate electrodes 110 and 210 are made of polysilicon, they can be removed using a selective wet etching process using hydroxide containing solution (e.g., ammonium hydroxide), deionized water, and/or other suitable solutions as the etchant that attacks polysilicon, and hardly attacks other materials on the wafer W. Due to the etch selectivity between polysilicon and oxide materials of the interfacial layers 108 and 208, the interfacial layers 108 and 208 remain on the respective semiconductor fins 104 and 204 after dummy poly gates 110 and 210 are removed by the selective etching.

Figure 13:
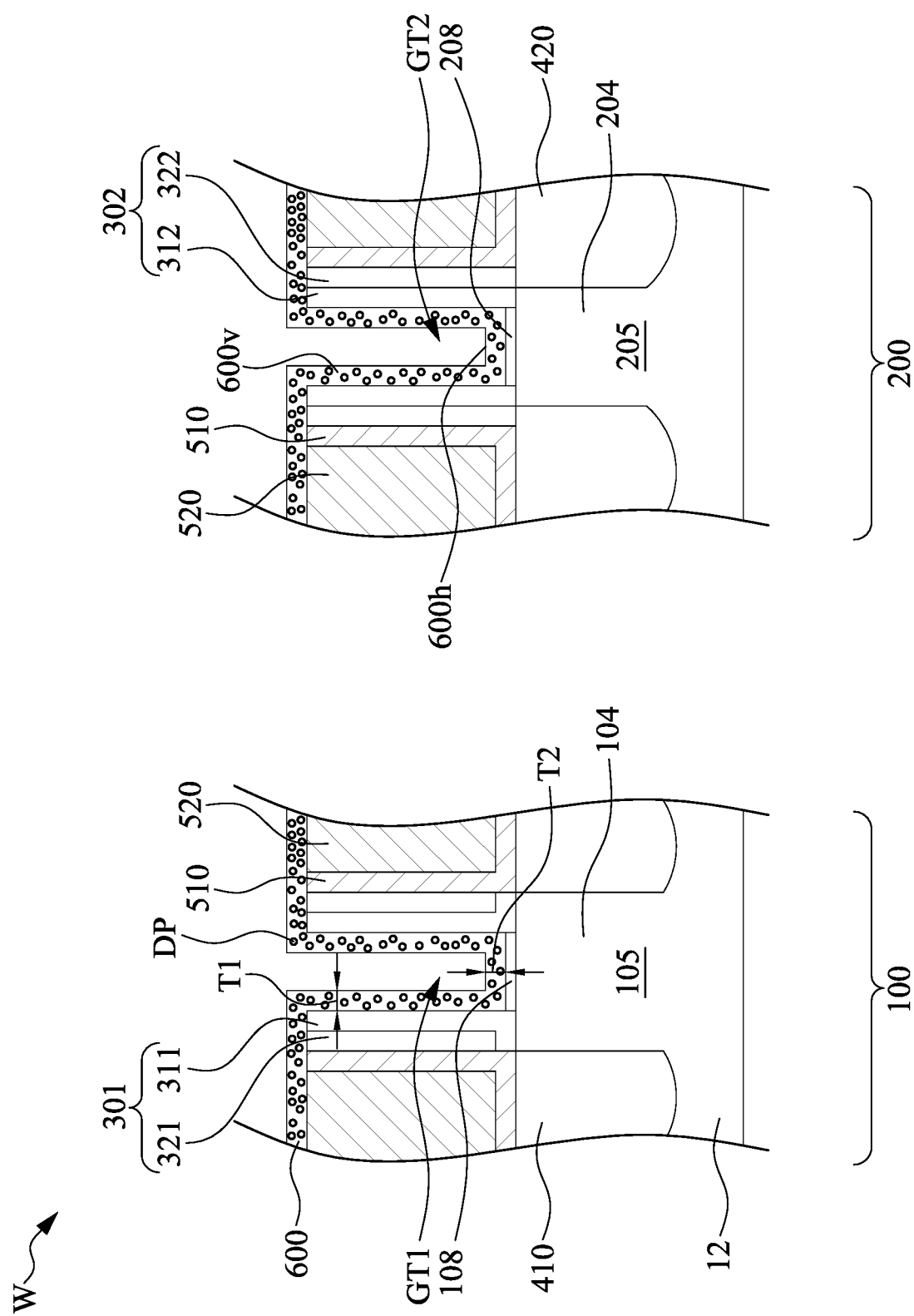

FIG. 13 illustrates forming a dopant source layer 600 on the wafer W. The respective step is illustrated as step S24 in the process flow as shown in FIG. 18B. The dopant source layer 600 is a doped polysilicon layer including dopants DP susceptible to subsequent diffusion into the inner spacers 311, 312 and outer spacers 321 and 322. In some embodiments, the dopant source layer 600 may be formed by sputtering, ALD, CVD, PECVD, metal organic CVD (MOCVD), furnace CVD (FCVD), plasma-enhanced ALD (PEALD), other suitable deposition methods, or a combination thereof. In some embodiments, species of the dopants 610 is selected such that dielectric constants of the inner spacers 311, 312 and the outer spacers 321 and 322 can be reduced after the dopants 610 are diffused into the inner spacers 311, 312 and the outer spacers 321 and 322. For example, the dopants 610 are fluorine, and thus the dopant source layer 600 can be interchangeably referred to as a fluorine-doped polysilicon layer. The fluorine-doped polysilicon layer 600 is an in-situ doped layer deposited using a silicon-containing gas and a fluorine-containing gas as precursor gases. Example silicon-containing gas includes silane ($SiH_4$), di-silane ($Si_2H_6$), or di-clorsilane ($SiCl_2H_4$), and example fluorine-containing gas includes $SF_x$ (e.g., $SF_4$, $SF_6$, or the like) or fluorine gas. The resultant fluorine-doped polysilcon layer 600 has a thickness in a range from about 0.5 nm to about 20 nm. In some other embodiments, the dopants may be, for example, nitrogen, hydrogen, carbon and/or other suitable species that is able to reduce the dielectric constant of silicon nitride.

In some embodiments, the dopant source layer 600 may be formed as a substantially conformal layer, and hence a thickness T1 of the substantially vertical portions 600v of the dopant source layer 600 on sidewalls of the inner spacers 311 and 312 is close to a thickness T2 of the substantially horizontal portions 600h of the dopant source layer 600. In some other embodiments, the dopant source layer 600 may be a non-conformal layer having different thicknesses T1 and T2.

Figure 14A:
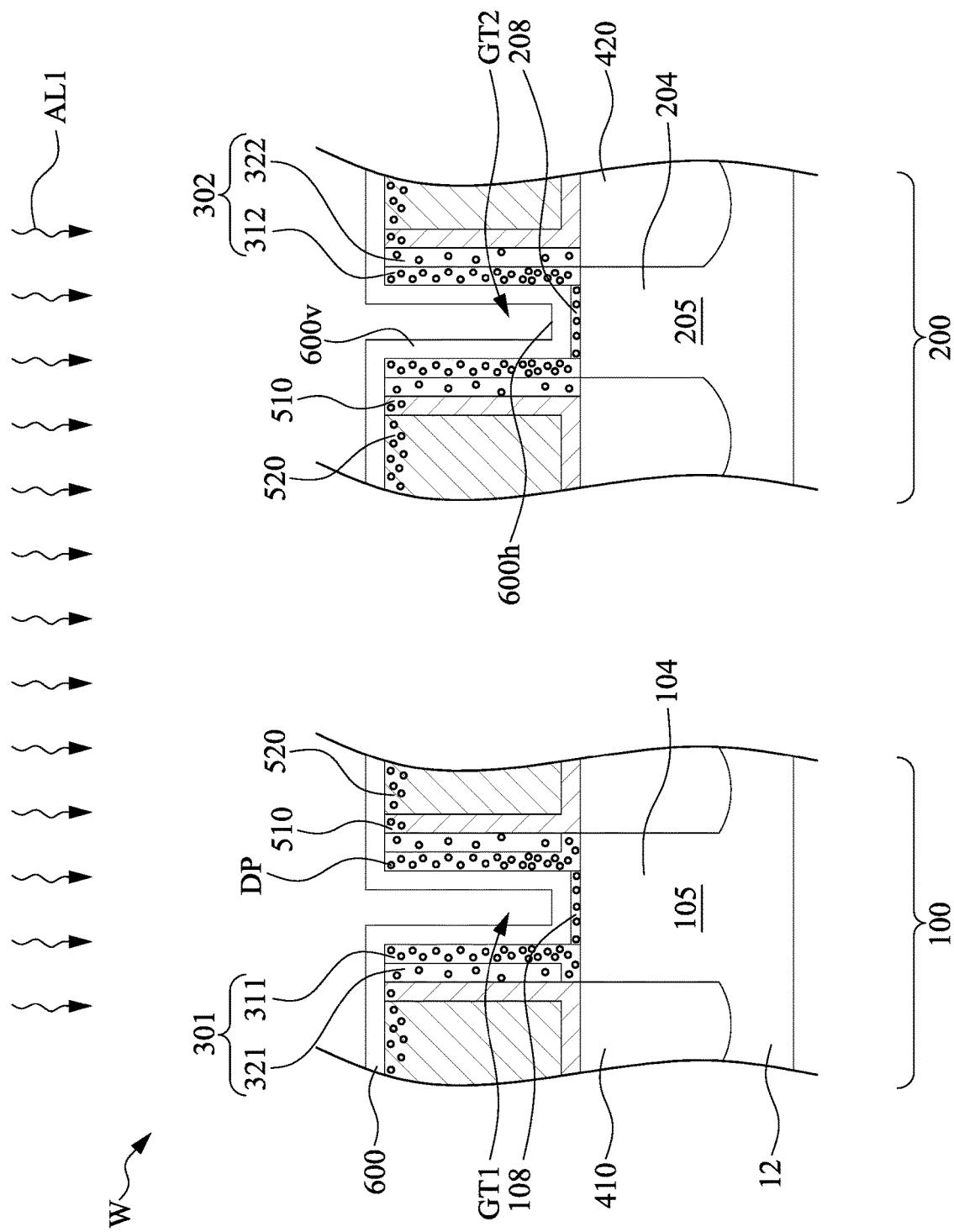

FIG. 14A illustrates performing an annealing process AL1 on the wafer W. The respective step is illustrated as step S25 in the process flow as shown in FIG. 18B. The annealing process AL1 diffuses the dopants DP from the dopant source layer 600 into the gate spacers 301, 302 and also activates the dopants DP in the gate spacers 301 and 302. In this way, the dielectric constants of the gate spacers 301 and 302 can be reduced by the dopants DP (e.g., fluorine, nitrogen, hydrogen, carbon and/or other suitable atoms). Stated differently, the dielectric constants of the doped gate spacers 301 and/or 302 after performing the annealing process AL1 are lower than the dielectric constants of the un-doped gate spacers 301 and/or 302 before performing the annealing process. Because the dopants DP can reduce the dielectric constants of the gate spacers 301 and 302, the dopants DP can be interchangeably referred to as k-value (i.e., dielectric constant) reduction impurities in the present disclosure. In some embodiments, the dopant concentration (e.g., fluorine atomic concentration, nitrogen atomic concentration, hydrogen atomic concentration and/or carbon atomic concentration) in the gate spacers 301 and/or 302 is in a range from about $1E11$ atoms/$cm^3$ to about $1E21$ atoms/$cm^3$ for reducing dielectric constants of the gate spacers 301 and/or 302. In some embodiments, the dielectric constant of the silicon nitride spacers can be reduced by from about 0.1% to about 25% by doping the dopants DP into the silicon nitride spacers.

Figure 14B:
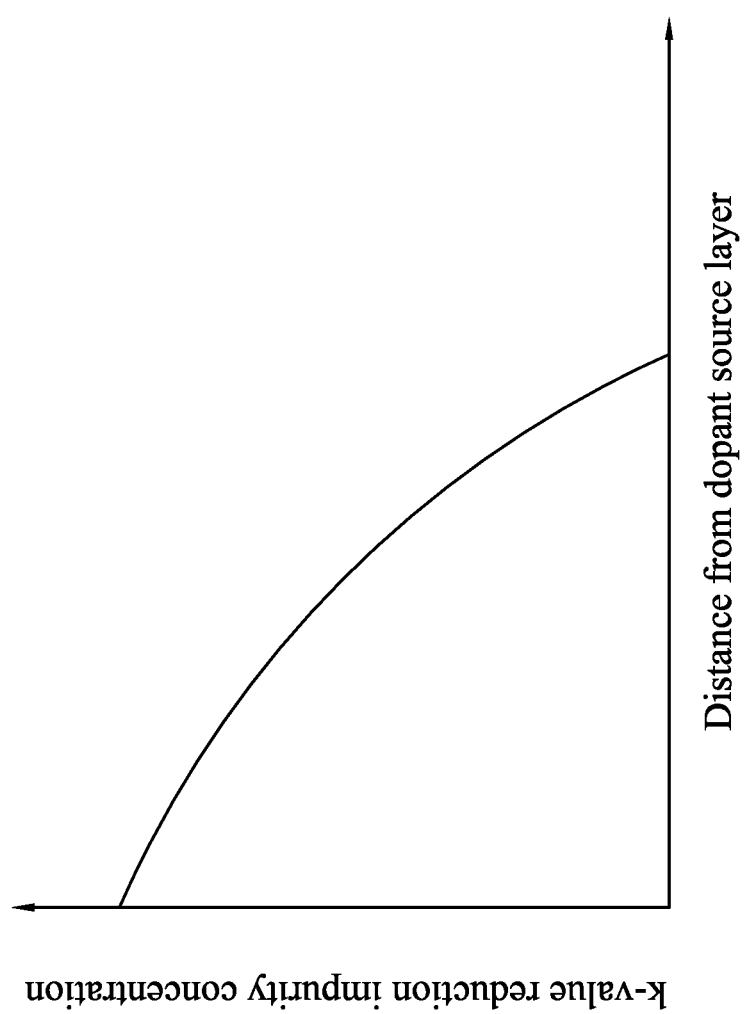
FIG. 14B is a graph illustrating a dopant concentration in the gate spacers as a function of a distance from the dopant source layer.

Because the dopants DP in the substantially vertical portions 600v of the dopant source layer 600 in the first device region 100 diffuse laterally into the gate spacers 301, the inner spacers 311 closest (proximal) to the substantially vertical portions 600v have higher maximum dopant concentrations (e.g., fluorine atomic concentration, nitrogen atomic concentration, hydrogen atomic concentration and/or carbon atomic concentration) than the outer spacers 321 furthest (distal) from the substantially vertical portions 600v. Similarly, in the second device region 200 the inner spacers 312 closest (proximal) to the substantially vertical portions 600v have higher maximum dopant concentrations (e.g., fluorine atomic concentration, nitrogen atomic concentration, hydrogen atomic concentration and/or carbon atomic concentration) than the outer spacers 322 furthest (distal) from the substantially vertical portions 600v. FIG. 14B is a graph illustrating a dopant concentration in the gate spacers 301 as a function of a distance from the dopant source layer 600. As illustrated in FIG. 14B, the annealing process AL1 may create a Gaussian distribution or a complementary error function distribution of dopants DP (e.g., fluorine) in the gate spacers 301.

In some embodiments, the dopants DP may be also diffused into the interfacial layers 108, 208, the CESL 510 and the ILD 520. Because the dopants DP are downwardly diffused from the horizontal portions 600h into the interfacial layers 108 and 208, upper portions of the interfacial layers 108 and 208 may have higher fluorine atomic concentrations than lower portions of the interfacial layers 108 and 208. Similarly, because the dopants DP are downwardly diffused from the horizontal portions 600h into the ILD layer 520, an upper portion of the ILD layer 520 may have a higher fluorine atomic concentration than a lower portion of the ILD layer 520.

In some embodiments, the annealing process AL1 may include one or more annealing processes performed at this stage to affect the solid phase diffusion of dopants DP from the dopant source layer 600 into the gate spacers 301 and 302. In some embodiments, the annealing process AL1 may include, for example, thermal diffusion, rapid thermal anneal (RTA), laser anneal and so on.

Figure 15:
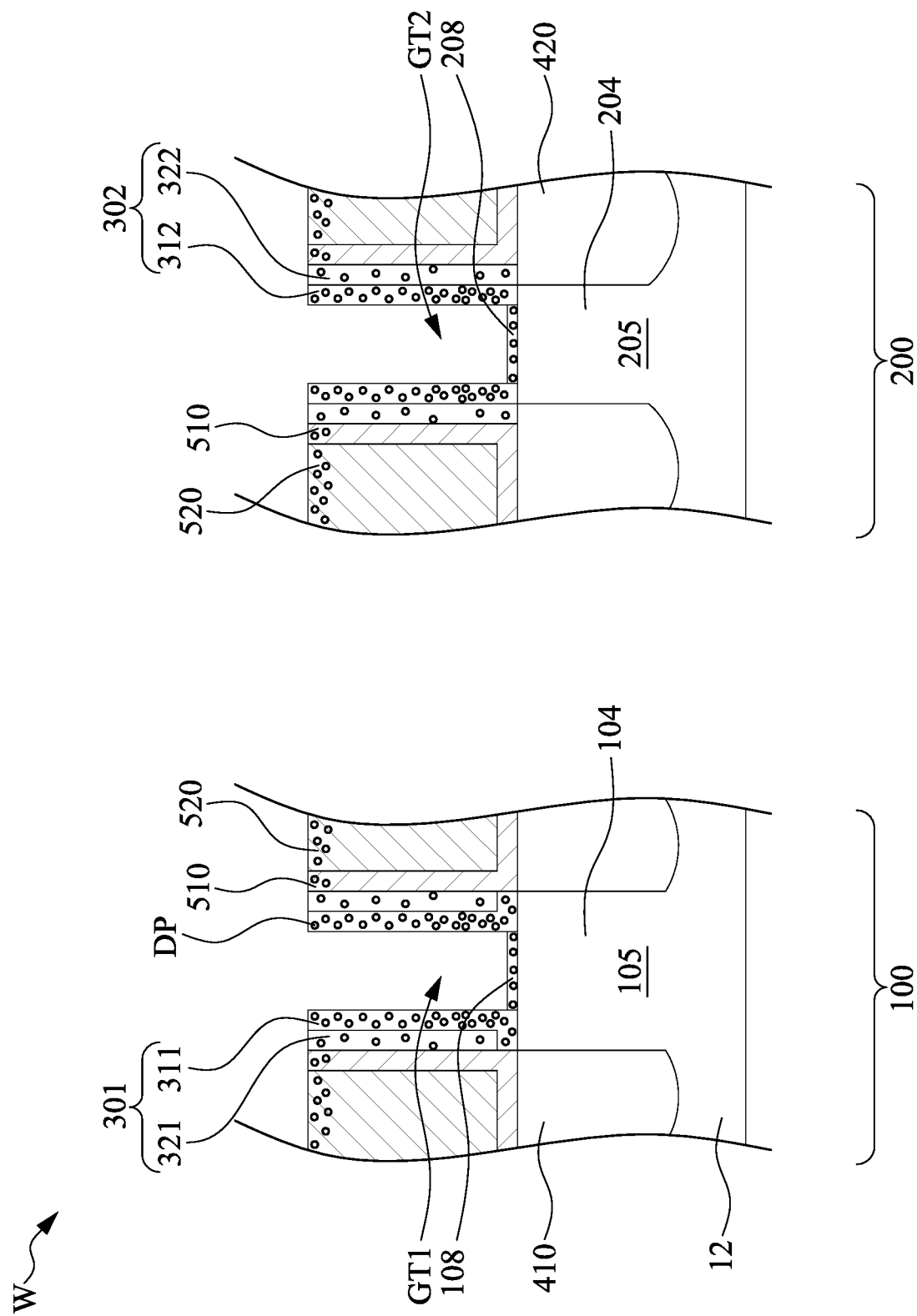

After the annealing process AL1 is performed, the dopant source layer 600 is removed from the first and second device regions 100 and 200, and the resulting structure is illustrated in FIG. 15. The respective step is illustrated as step S26 in the process flow as shown in FIG. 18B. In some embodiments where the dopant source layer 600 include polysilicon, the dopant source layer 600 can be removed by an etching process using the same etchant as that used in the dummy gate removal process as illustrated in FIG. 12. In greater detail, the dopant source layer 600 can be removed using a selective etching process that etches the dopant source layer 600 at a faster etch rate than it etches other materials on the wafer W. For example, the dopant source layer 600 formed of polysilicon can be removed using a selective wet etching process using hydroxide containing solution (e.g., ammonium hydroxide), deionized water, and/or other suitable solutions as the etchant that attacks polysilicon, and hardly attacks other materials on the wafer W. Due to the etch selectivity between polysilicon and oxide materials of the interfacial layers 108 and 208 and nitride materials of the gate spacers 301 and 302, the interfacial layers 108, 208 and the gate spacers 301, 302 remain on the respective semiconductor fins 104 and 204 after the dopant source layer 600 is removed by the selective etching. In some embodiments, the etch duration of removing the polysilicon layer 600 is shorter than the etch duration of the polysilicon gate electrodes 110 and 210 (as illustrated in FIG. 11) if they are removed using the same etchant, because the polysilicon layer 600 is thinner than the polysilicon gate electrodes 110 and 210.

Figure 16:
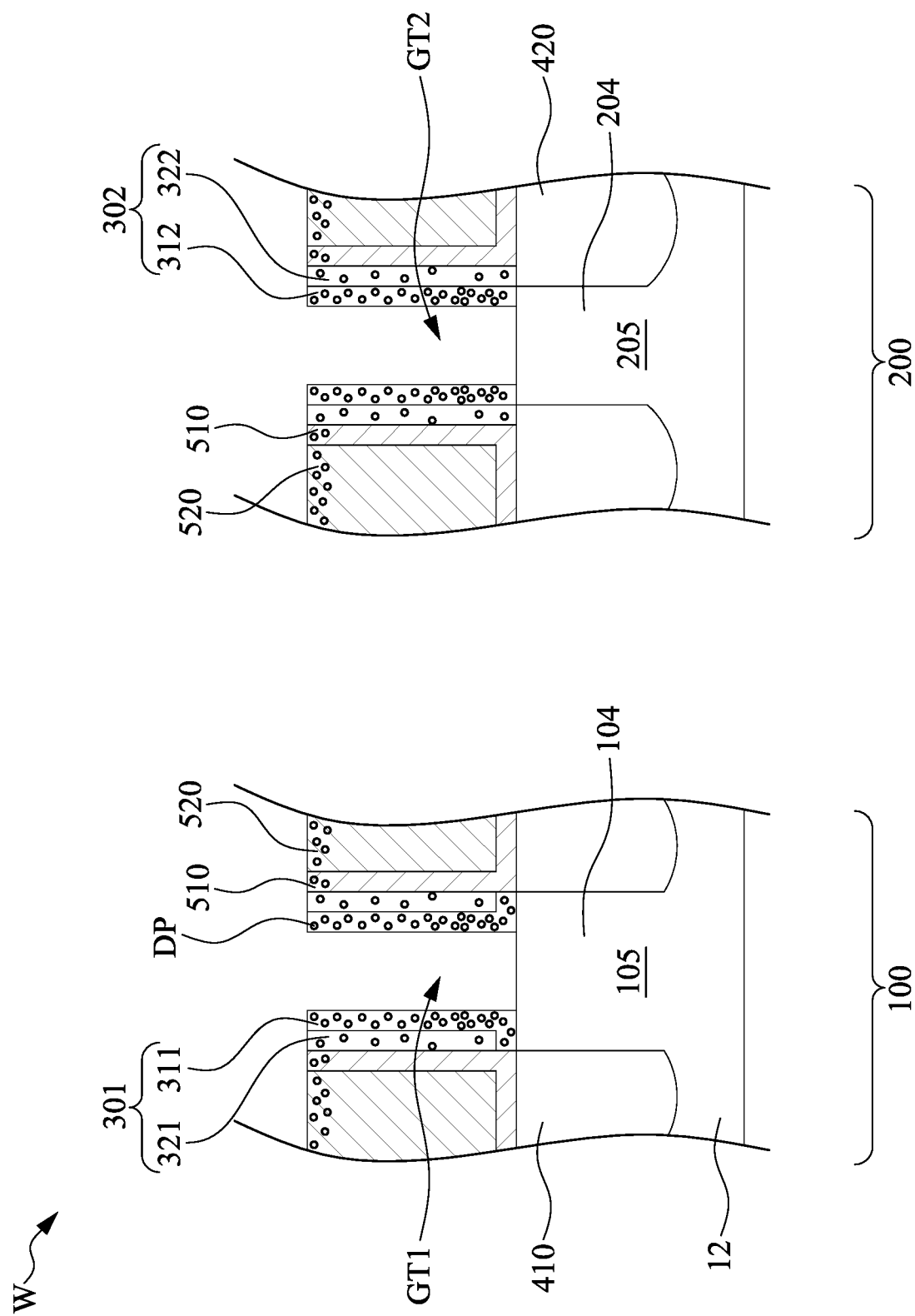

Next, the interfacial layers 108 and 208 are optionally removed from the first and second device regions 100 and 200, and the resulting structure is shown in FIG. 16. The respective step is illustrated as step S27 in the process flow as shown in FIG. 18B. The interfacial layers 108 and 208 can be removed using a selective etching process that etches the interfacial layers 108 and 208 at a faster etch rate than it etches other materials on the wafer W. For example, in some embodiments where the interfacial layers 108 and 208 include silicon oxide, the removal of the interfacial layers 108 and 208 can be performed using a dry etching process (e.g., reaction ion etching), a wet etching process (e.g., using diluted HF), or a combination thereof. In some embodiments, the gas etchants used in the dry etching process can include chlorine, fluorine, bromine, or a combination thereof. Due to the etch selectivity between the oxide layers 108, 208 and the nitride-based spacers 301, 302, the nitride-based spacers 301 and 302 remain substantially intact during the etching the oxide layers 108 and 208. In some embodiments where the ILD layer 520 includes oxide, the ILD layer 520 may be etched back during etching the oxide layers 108 and 208. As a result, an upper portion of the ILD layer 520 doped with the dopants DP may be removed in the etching process.

Figure 17:
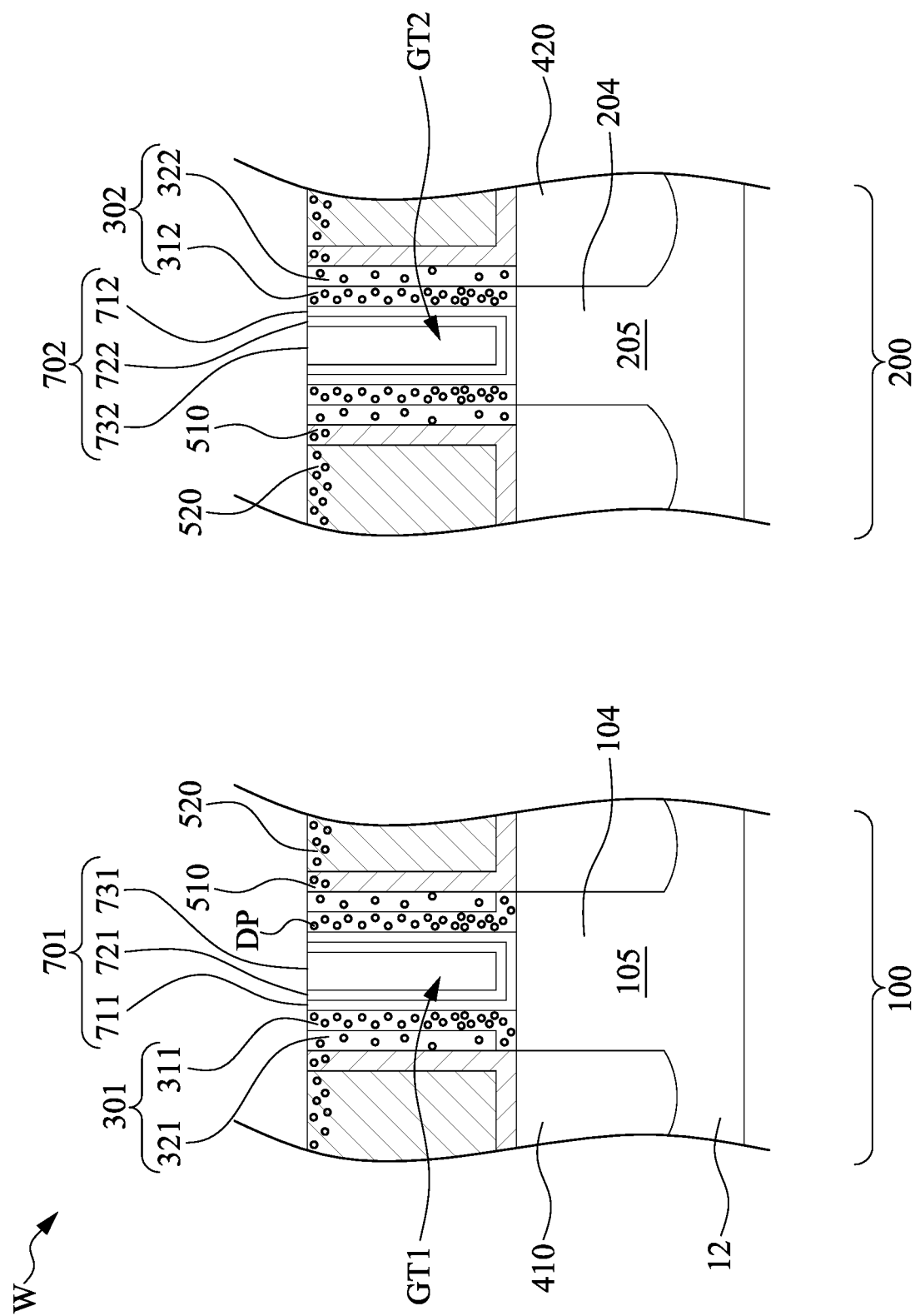

FIG. 17 illustrates forming replacement gate stacks 701 and 702 in the gate trenches GT1 and GT2, respectively. The respective step is also illustrated as step S28 in the process flow shown in FIG. 18B. The gate stack 701 may include a gate dielectric layer 711, a work function conductor 721 on the gate dielectric layer 711 and a filling conductor 731 on the work function conductor 721. Similarly, the gate stack 702 may include a gate dielectric layer 712, a work function conductor 722 and a filling conductor 732. In some embodiments, the gate dielectric layers 711 and 712 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layers 711 and 712 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric layers 711 and 712 may have a multilayer structure such as one layer of silicon oxide (e.g., interfacial layer) and another layer of high-k material.

The work function conductors 721 and 722 may include work function metals to provide a suitable work function for the gate stacks 701 and 702. For example, if the first device region 100 is an NFET region, the work function conductor 721 may include one or more n-type work function metals (N-metal) for forming an n-type FinFET. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, if the second device region 200 is a PFET region, the work function conductor 722 may include one or more p-type work function metals (P-metal) for forming a p-type FinFET. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments where the first device region 100 is a PFET region and the second device region 200 is an NFET region, the work function conductor 721 includes one or more P-metals, and the work function conductor 722 includes one or more N-metals.

The filling conductors 731 and 732 respectively fill recesses in the work function conductors 721 and 722. The filling conductors 731 and 732 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Exemplary method of forming the gate stacks 701 and 702 may include depositing a blanket gate dielectric layer, depositing one or more work function conductor layers over the blanket gate dielectric layer, removing some work function conductive layers from the first device region 100 or the second device region 200, forming a filling conductor layer over the work function conductor layers, and performing a CMP process to remove excessive materials of the filling conductor layer, the work function conductor layers and the gate dielectric layer outside the gate trenches. Because the gate stacks 701 and 702 are formed after the solid phase diffusion resulting from the annealing process AL1 (as illustrated in FIG. 14A), the gate stacks 701 and 702 may be free from the dopants DP (e.g., fluorine atoms).

Although the embodiments discussed above use solid phase diffusion to dope dopants (e.g., fluorine) into the gate spacers 301 and 302, some other embodiments of the present disclosure can form the doped gate spacers 301 and 302 using different methods than the solid phase diffusion. FIGS. 19-22 illustrate exemplary cross sectional views of various stages for manufacturing transistors according to some other embodiments of the present disclosure. It is understood that additional operations can be provided before, during, and after processes shown by FIGS. 19-22, and some of the operations described below can be replaced or eliminated, for additional embodiments of the method. The order of the operations/processes may be interchangeable. The same or similar configurations, materials, processes and/or operation as described with FIGS. 1-17 may be employed in the following embodiments, and the detailed explanation may be omitted.

Figure 19:
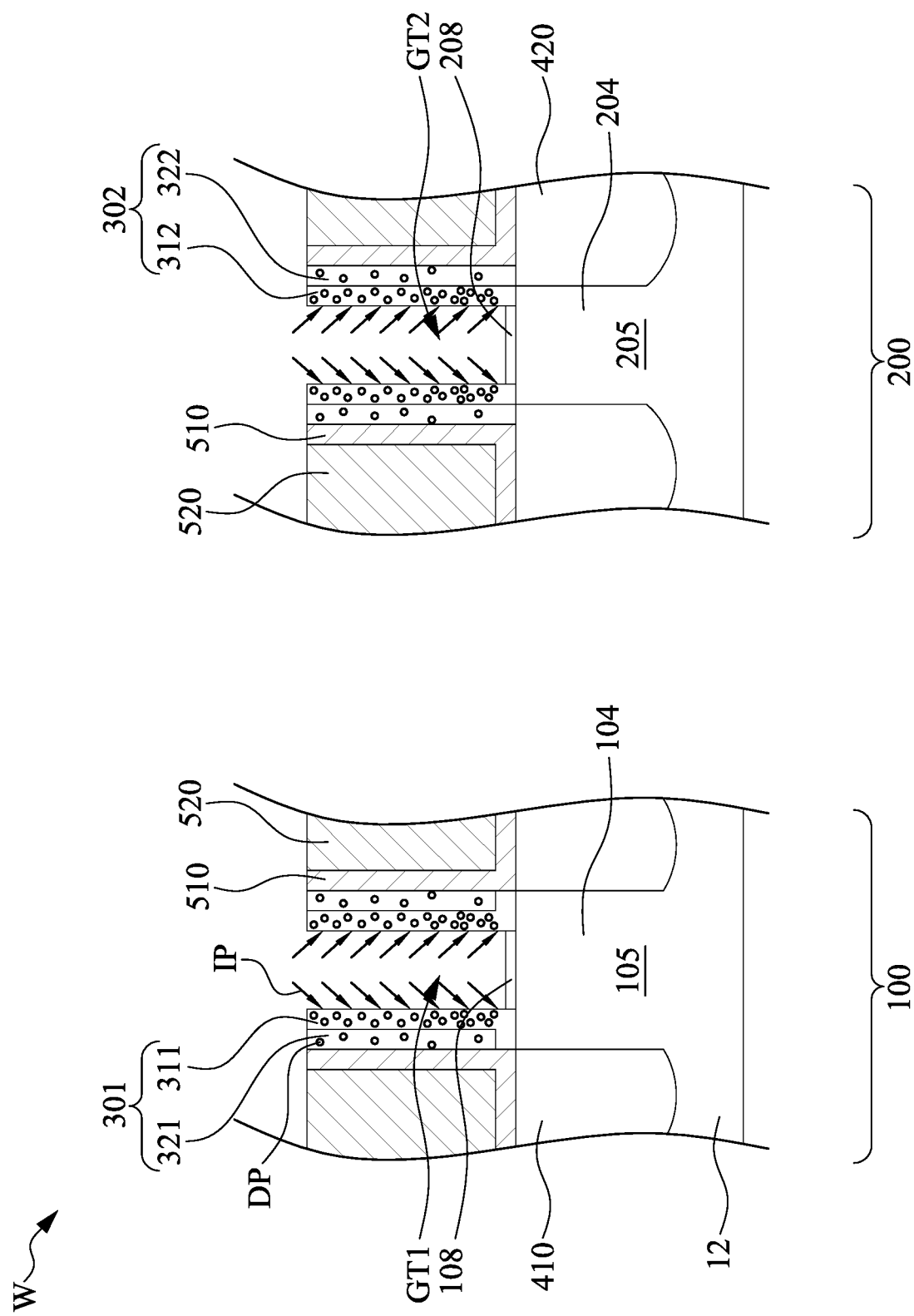
FIGS. 19-22 illustrate cross-sectional views of intermediate stages in the formation of transistors in accordance with some embodiments.

FIG. 19 illustrates an implantation process IP performed after the structure as shown in FIG. 12 is formed. In some embodiments, the implantation process IP is performed to implant impurities (i.e., dopant ions) at a controlled angle inclined with respect to sidewalls of the gate spacers 301 and 302 at a dose of about 1E13 atoms/cm³ to about 5E15 atoms/cm³, at an energy of about 0.0.5 KeV to about 5 KeV, and at a temperature from about −200° C. to about to about 200° C. As a result of the implantation process IP, the ionized dopants DP (e.g., fluorine, nitrogen, hydrogen, carbon or other suitable species that is able to reduce the dielectric constant of silicon nitride) can be implanted into the gate spacers 301 and 302.

Figure 20:
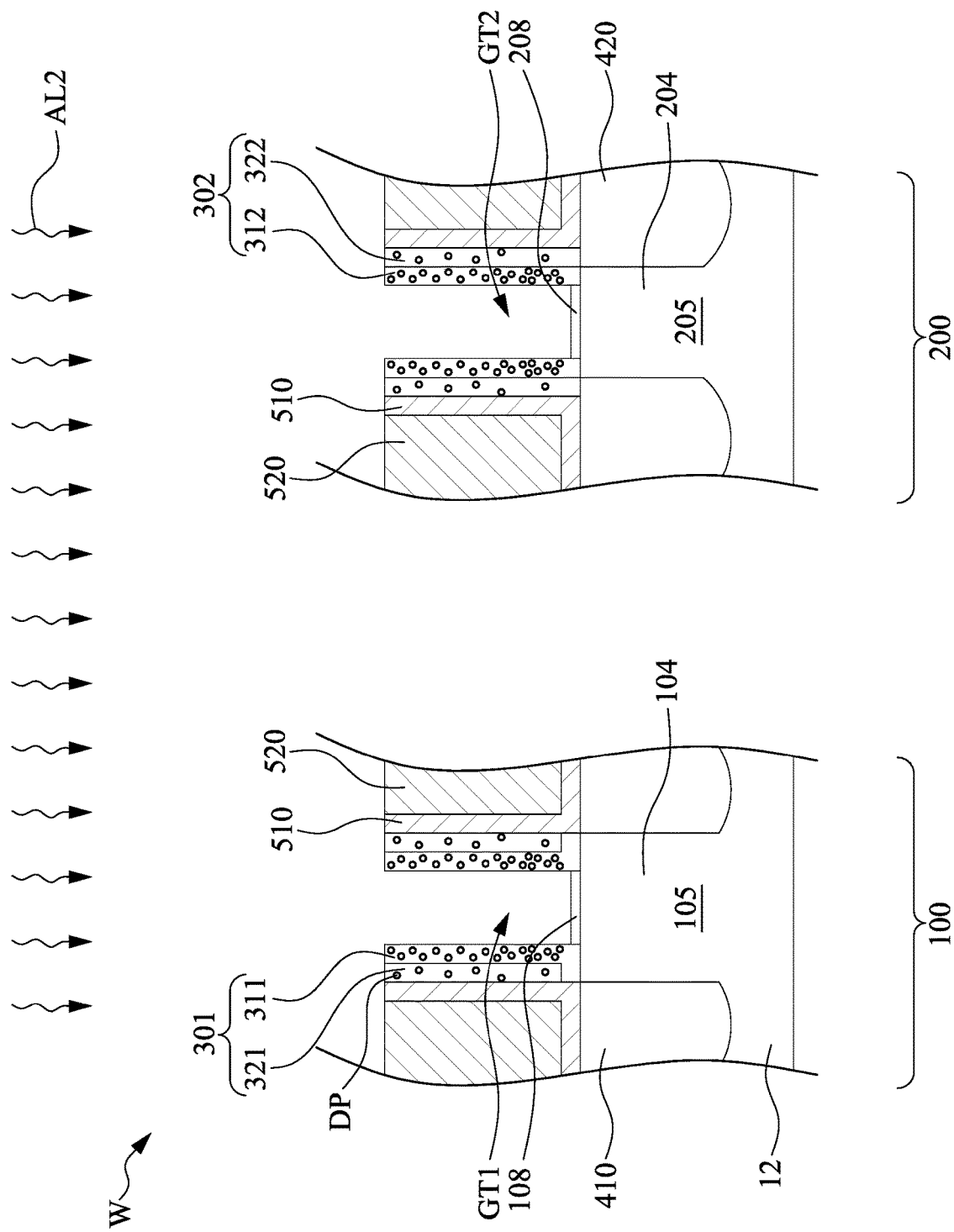

FIG. 20 illustrates performing an annealing process AL2 on the wafer W after the implantation process IP. The annealing process AL2 can repair damages due to the ion implantation process IP and to activate the implanted dopant impurities DP. In this way, the dielectric constants of the gate spacers 301 and 302 can be reduced by the dopants DP (e.g., fluorine, nitrogen, hydrogen, carbon and/or other suitable atoms).

Figure 21:
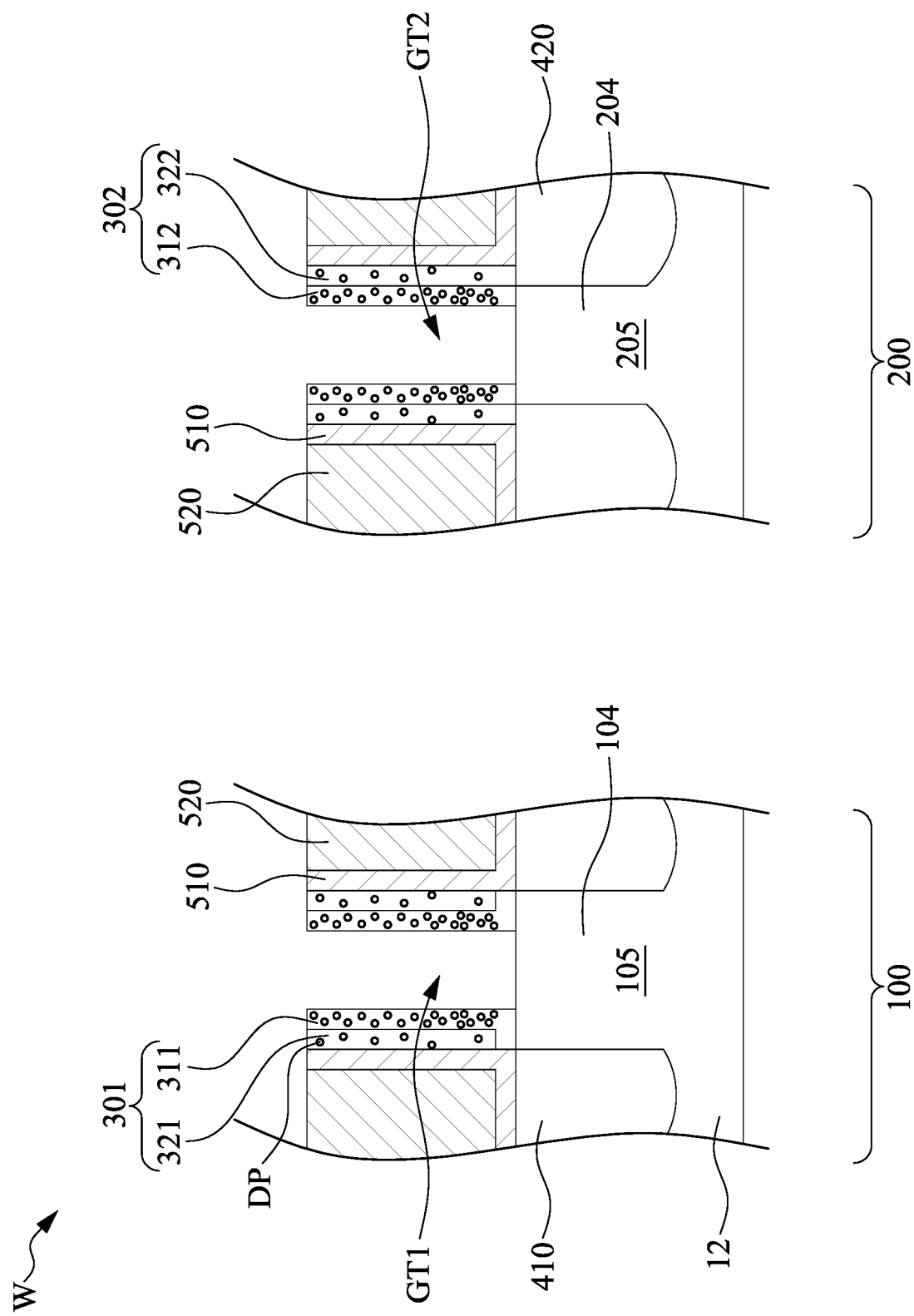

After the annealing process AL2 as shown in FIG. 20 is performed, the interfacial layers 108 and 208 are optionally removed from the first and second device regions 100 and 200, and the resulting structure is shown in FIG. 21. This process step is similar to that of FIG. 16, and thus details thereof are not repeated for the sake of brevity.

Figure 22:
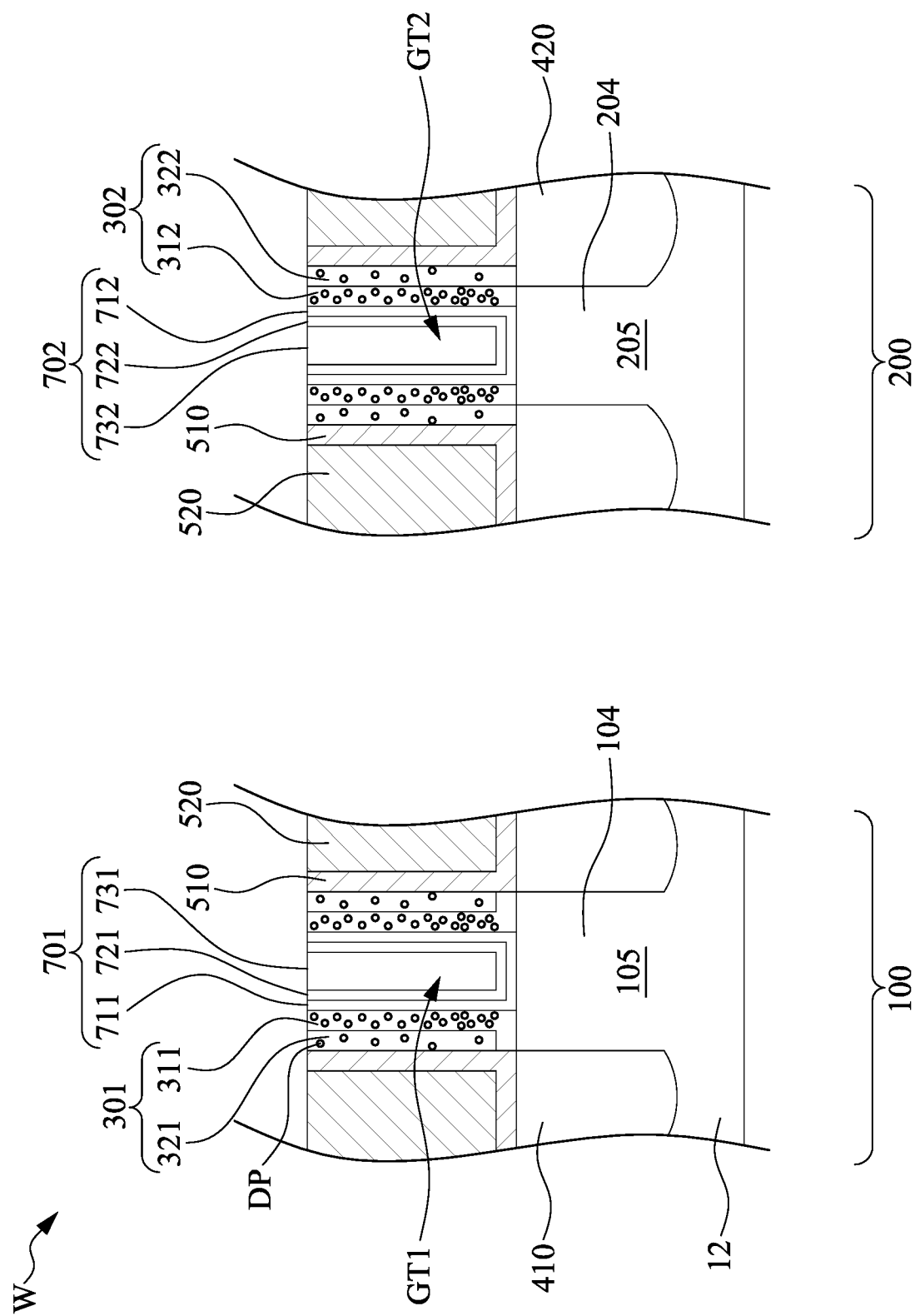

Next, as shown in FIG. 22, replacement gate stacks 701 and 702 are formed in the gate trenches GT1 and GT2, respectively. This process step is similar to that of FIG. 17, and thus details thereof are not repeated for the sake of brevity.

Figure 23:
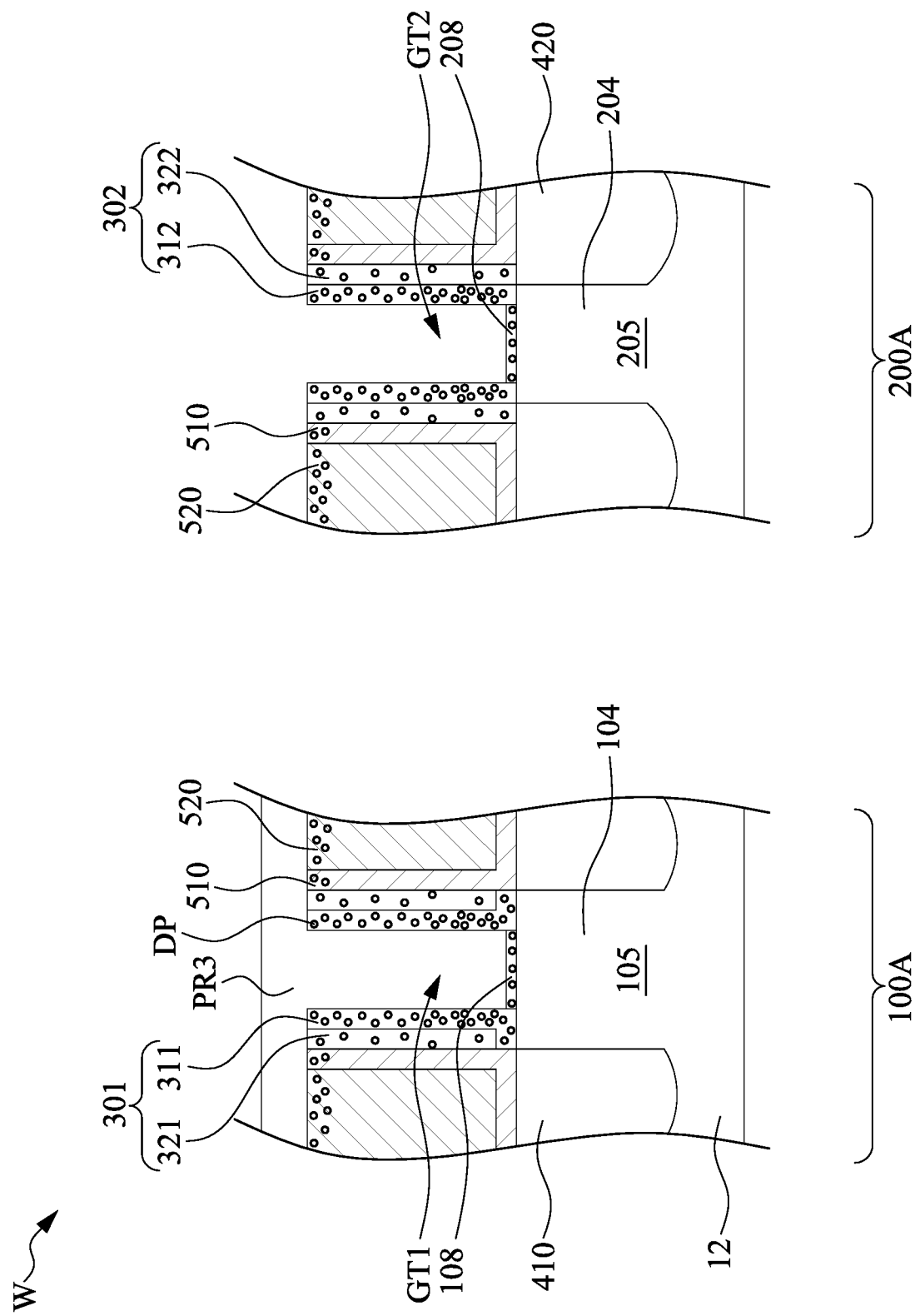
FIGS. 23-25 illustrate exemplary cross sectional views of various stages for manufacturing transistors according to some embodiments of the present disclosure.
Figure 24:
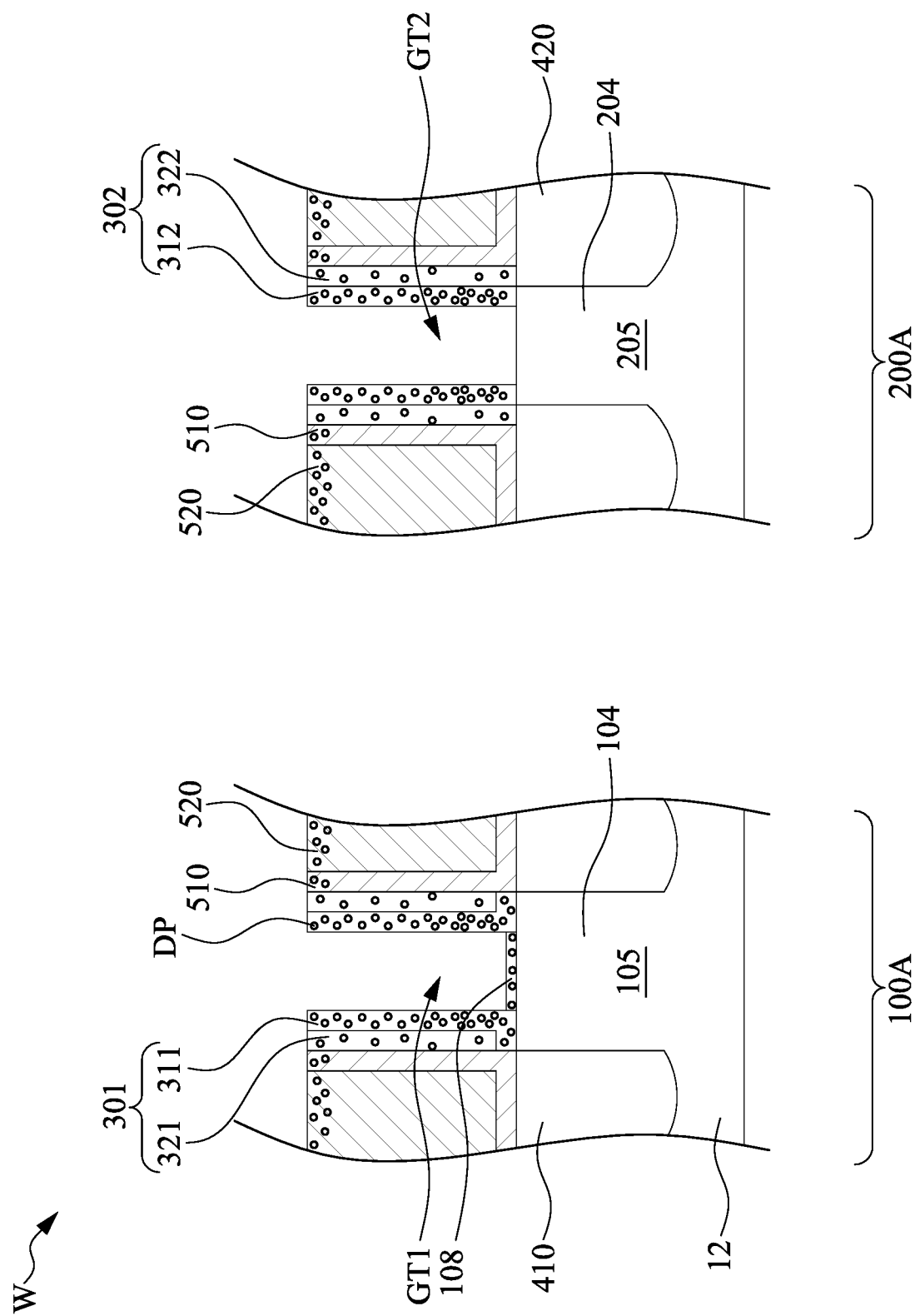
Figure 25:
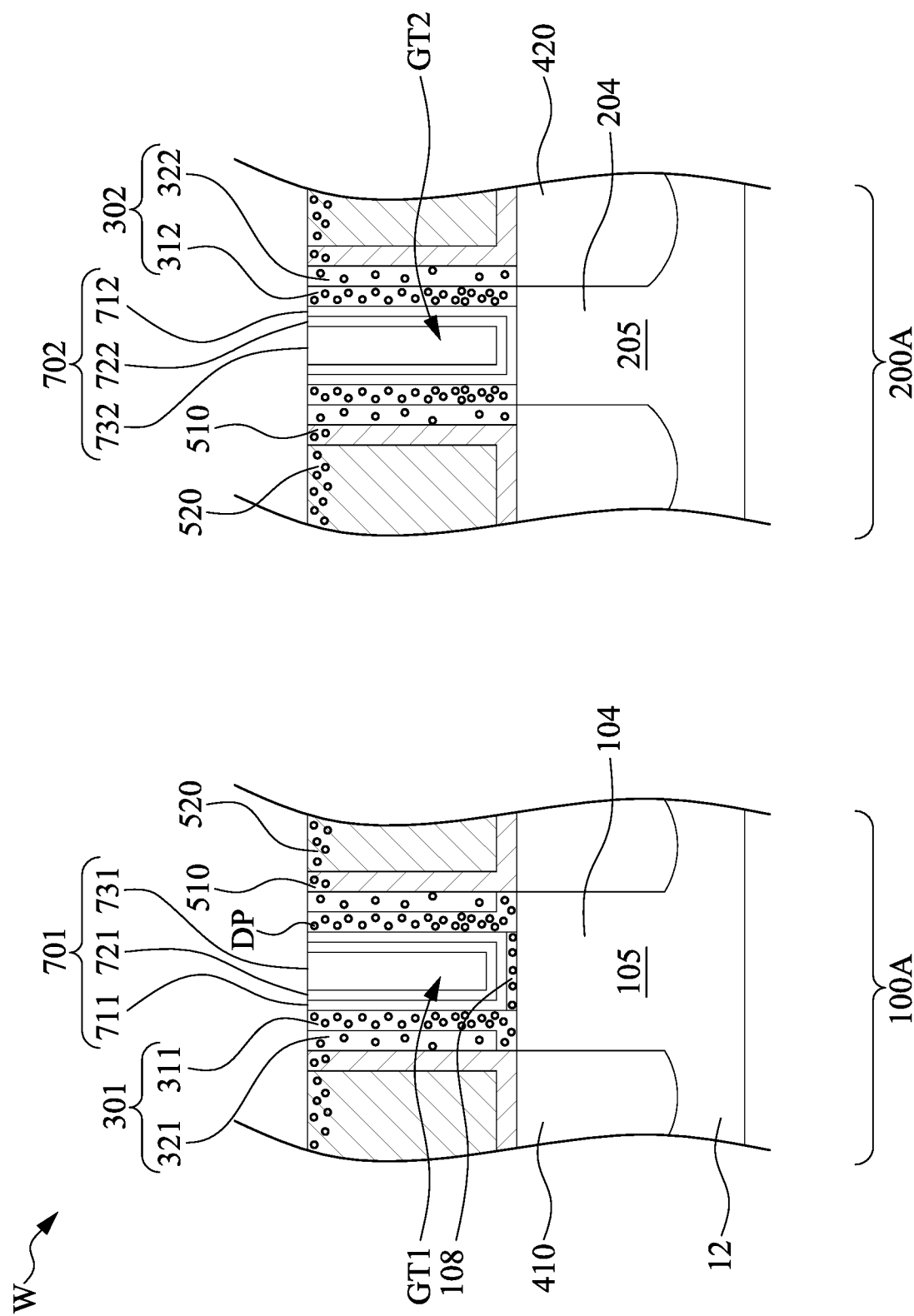

FIGS. 23-25 illustrate exemplary cross sectional views of various stages for manufacturing transistors according to some other embodiments of the present disclosure. It is understood that additional operations can be provided before, during, and after processes shown by FIGS. 23-25, and some of the operations described below can be replaced or eliminated, for additional embodiments of the method. The order of the operations/processes may be interchangeable. The same or similar configurations, materials, processes and/or operation as described with FIGS. 1-17 may be employed in the following embodiments, and the detailed explanation may be omitted.

After the structure as shown in FIG. 15 is formed, a photoresist mask PR3 (e.g., a single-layer photoresist or a tri-layer photoresist) is applied and patterned to cover the first device region 100A and leaves the second region 200A uncovered, as shown in FIG. 23. Next, the interfacial layer 208 is removed from the second device region 200A, followed by removing the photoresist mask PR3 in an ashing step, such as using oxygen plasma. The resulting structure is illustrated in FIG. 24. As a result of the steps as shown in FIGS. 23 and 24, the interfacial layer 108 remains on the semiconductor fin 104, but the semiconductor fin 204 is free from coverage by the interfacial layer 208. In this way, the device formed in the first device region 100A can be an I/O device, and the interfacial layer 108 can act as an I/O oxide layer which is thick enough to provide protection from electrostatic discharge (ESD) events. On the contrary, the device formed in the second device region 200A can be a non-I/O device without the I/O oxide layer.

The I/O devices can be parts of peripheral circuits (e.g., I/O circuits) formed in peripheral regions 100A (also can be referred as "I/O regions" or "high voltage regions") of the integrated circuit (IC). In contrast, the non-I/O devices can be parts of core circuits (also can be referred as "logic circuits" or "memory circuits") formed in core regions 200A (also can be referred as "logic regions" or "memory regions") of the IC. The I/O devices can be configured to handle the input/output voltages/currents of the IC and to tolerate a greater amount of voltage or current swing than the non-IO devices. In some embodiments, the non-I/O devices are referred as core devices, logic devices, and/or memory devices that are not configured to handle the input/output voltages/currents directly. In some embodiments, the non-I/O devices include logic gates such as, for example, NAND, NOR, INVERTER, or a combination thereof. In some embodiments, the non-I/O devices include a memory device such as, for example, a static random-access memory (SRAM) device.

Next, as shown in FIG. 25, replacement gate stacks 701 and 702 are formed in the I/O region 100A and the core region 200A, respectively. This process step is similar to that of FIG. 17, and thus details thereof are not repeated for the sake of brevity. In the I/O region 100A, the I/O oxide layer 108 remains between the replacement gate stack 701 and the semiconductor fin 104. Because the dopants DP (e.g., fluorine, nitrogen, hydrogen, carbon and/or other suitable species that is able to reduce the dielectric constant of silicon nitride) may be diffused into the I/O oxide layer 108 as discussed previously with respect to FIG. 14A, the I/O oxide layer 108 may still include the dopants DP between the replacement gate stack 701 and the semiconductor fin 104. Moreover, the upper portion of the I/O oxide layer 108 may have a higher dopant concentration (e.g., fluorine atomic concentration, nitrogen atomic concentration, hydrogen atomic concentration and/or carbon atomic concentration) than the lower portion of the I/O oxide layer 108, because the dopants DP are downwardly diffused from the horizontal portions 600h of the dopant source layer 600 into the I/O oxide layer 108, as discussed previously with respect to FIG. 14A. On the other hand, the dopants DP are absent between the replacement gate stack 702 and the semiconductor fin 204, because the interfacial layer 208 doped with the dopants DP is removed from the core region 200A before forming the replacement gate stack 702.

Figure 26:
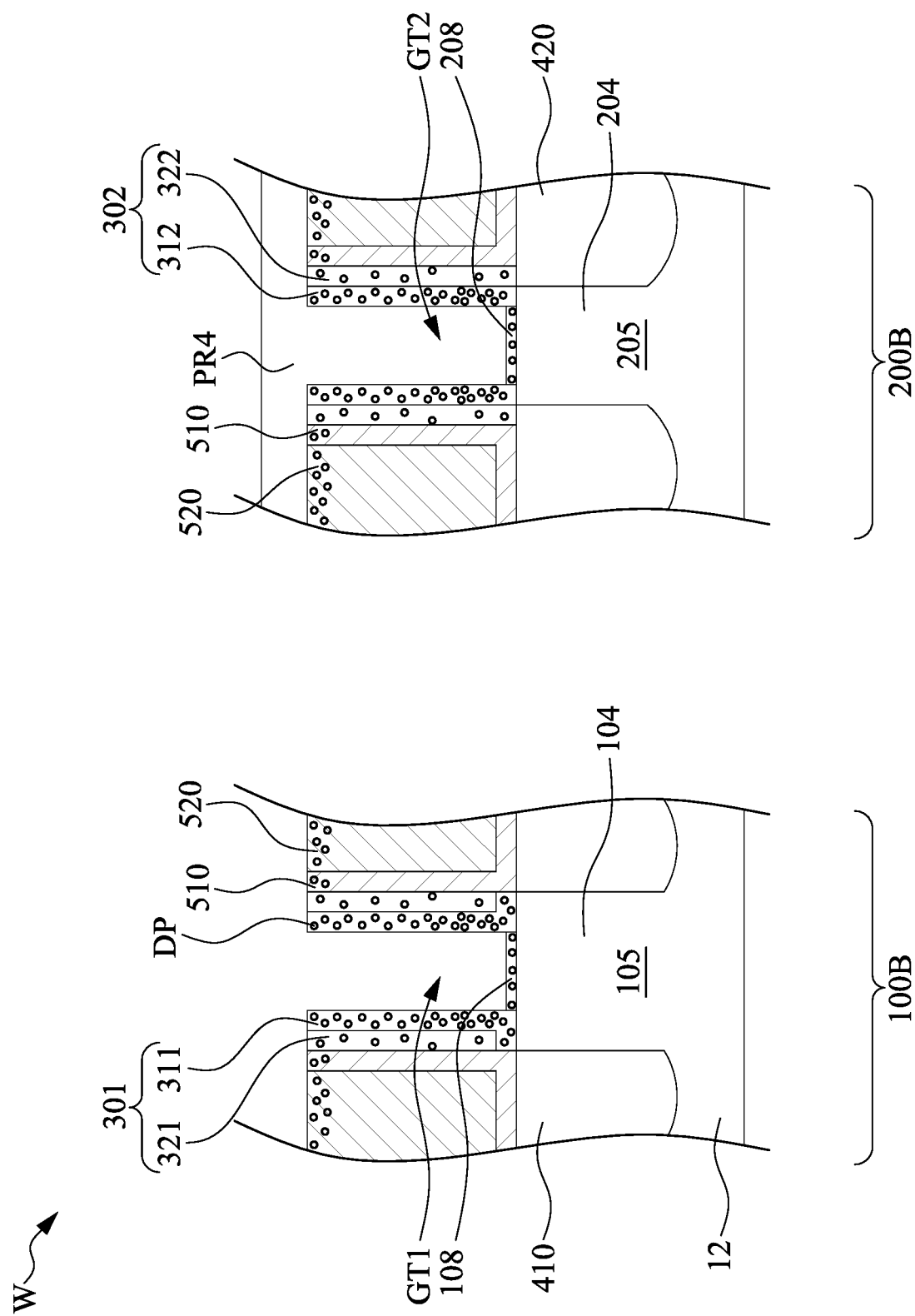
FIGS. 26-28 illustrate exemplary cross sectional views of various stages for manufacturing transistors according to some embodiments of the present disclosure.
Figure 27:
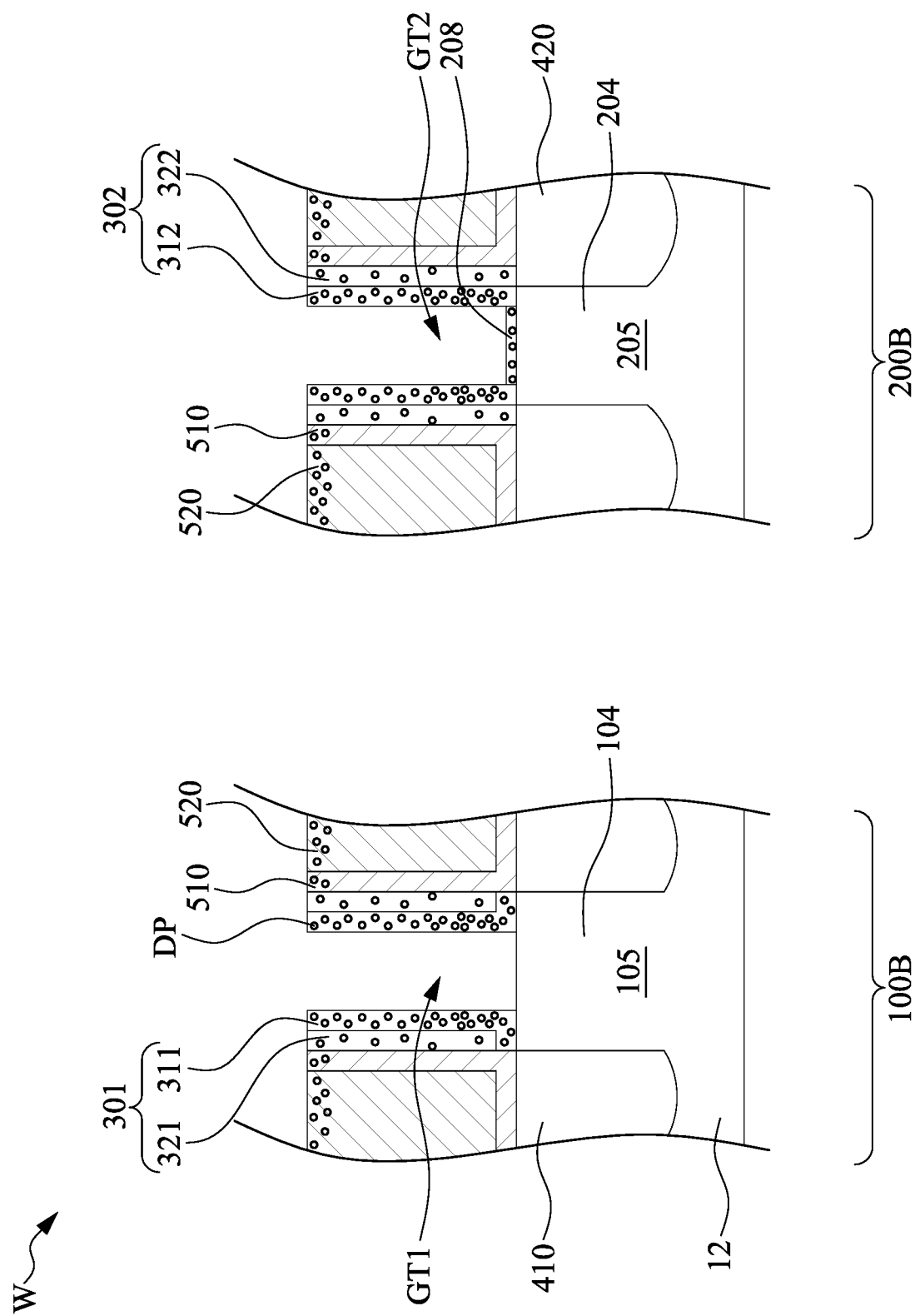
Figure 28:
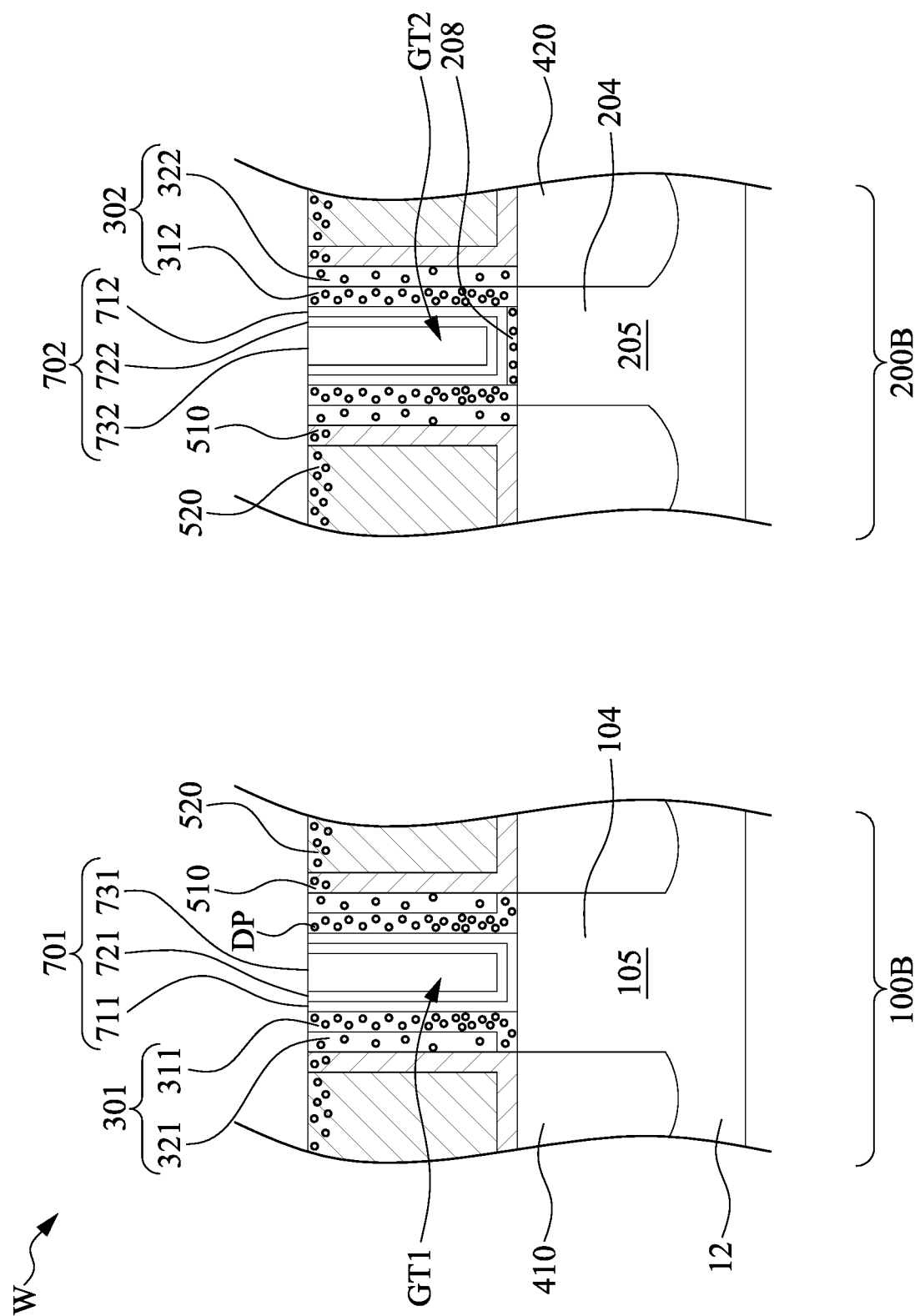

FIGS. 26-28 illustrate exemplary cross sectional views of various stages for manufacturing transistors according to some other embodiments of the present disclosure. It is understood that additional operations can be provided before, during, and after processes shown by FIGS. 26-28, and some of the operations described below can be replaced or eliminated, for additional embodiments of the method.

The order of the operations/processes may be interchangeable. The same or similar configurations, materials, processes and/or operation as described with FIGS. 1-17 may be employed in the following embodiments, and the detailed explanation may be omitted.

After the structure as shown in FIG. 15 is formed, a photoresist mask PR4 (e.g., a single-layer photoresist or a tri-layer photoresist) is applied and patterned to cover the second device region 200B and leaves the first device region 100B uncovered, as shown in FIG. 26. Next, the interfacial layer 108 is removed from the first device region 100B, followed by removing the photoresist mask PR4 in an ashing step, such as using oxygen plasma. The resulting structure is illustrated in FIG. 27. As a result of the steps as shown in FIGS. 26 and 27, the interfacial layer 208 remains on the semiconductor fin 204, but the semiconductor fin 104 is free from coverage by the interfacial layer 108. In this way, the device formed in the second device region 200B can be an I/O device, and the interfacial layer 208 can act as an I/O oxide layer which is thick enough to provide protection from electrostatic discharge (ESD) events. On the contrary, the device formed in the first device region 100B can be a non-I/O device (e.g., core device) without the I/O oxide layer. In such embodiments, the first device region 100B is referred to as a core region, and the second device region 200B is referred to as an I/O region.

Next, as shown in FIG. 28, replacement gate stacks 701 and 702 are formed in the core region 100B and the I/O region 200B, respectively. This process step is similar to that of FIG. 17, and thus details thereof are not repeated for the sake of brevity. In the I/O region 200B, the I/O oxide layer 208 remains between the replacement gate stack 702 and the semiconductor fin 204. Because the dopants DP (e.g., fluorine, nitrogen, hydrogen, carbon and/or other suitable species that is able to reduce the dielectric constant of silicon nitride) may be diffused into the I/O oxide layer 208 as discussed previously with respect to FIG. 14A, the I/O oxide layer 208 may still include the dopants DP between the replacement gate stack 702 and the semiconductor fin 204. Moreover, the upper portion of the I/O oxide layer 208 may have a higher dopant concentration (e.g., fluorine atomic concentration, nitrogen atomic concentration, hydrogen atomic concentration and/or carbon atomic concentration) than the lower portion of the I/O oxide layer 208, because the dopants DP are downwardly diffused from the horizontal portions 600*h* of the dopant source layer 600 into the I/O oxide layer 208, as discussed previously with respect to FIG. 14A. On the other hand, the dopants DP are absent between the replacement gate stack 701 and the semiconductor fin 104, because the interfacial layer 108 doped with the dopants DP is removed from the core region 100B before forming the replacement gate stack 701.

Figure 29:
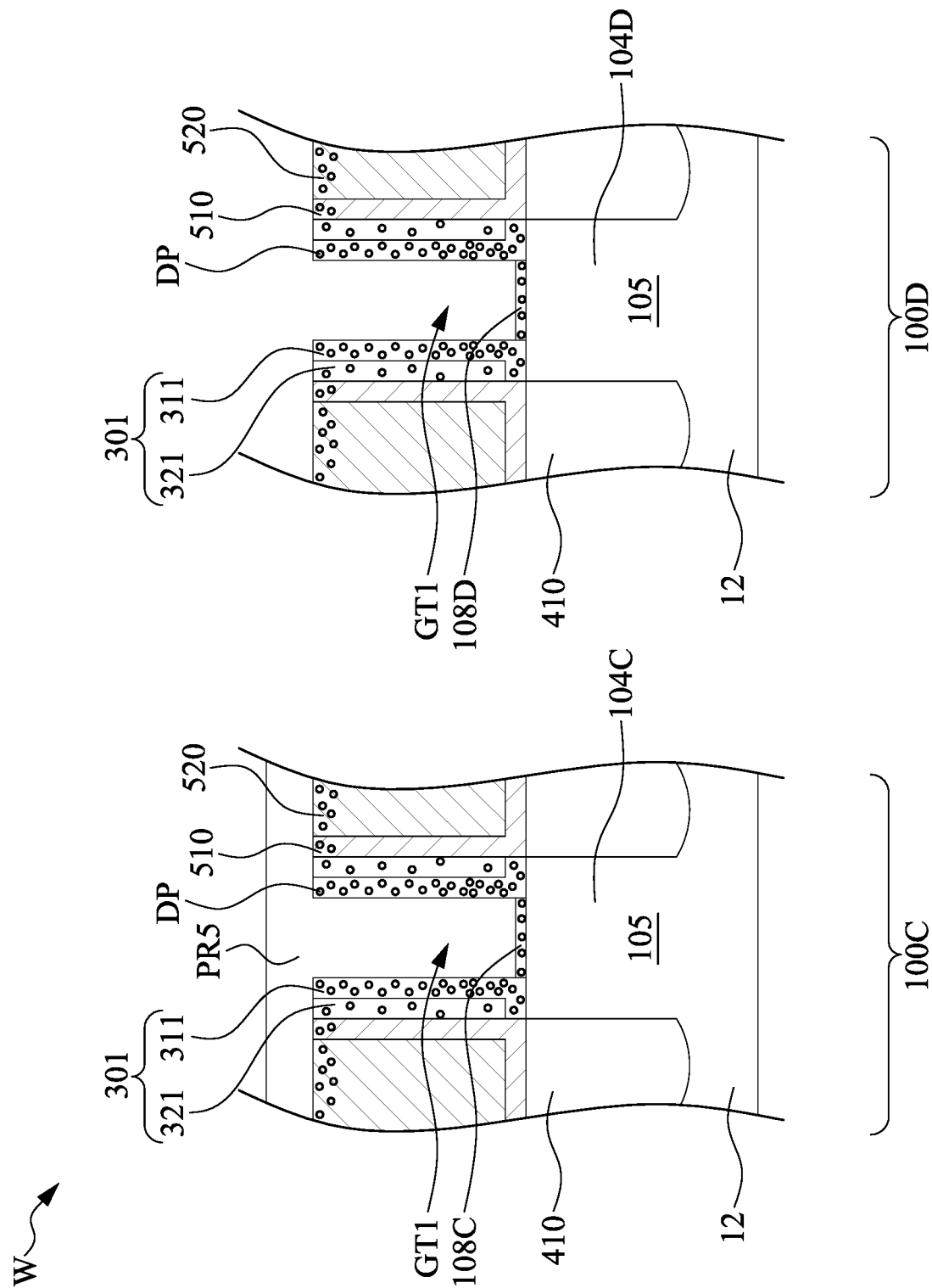
FIGS. 29-31 illustrate exemplary cross sectional views of various stages for manufacturing transistors according to some embodiments of the present disclosure.
Figure 30:
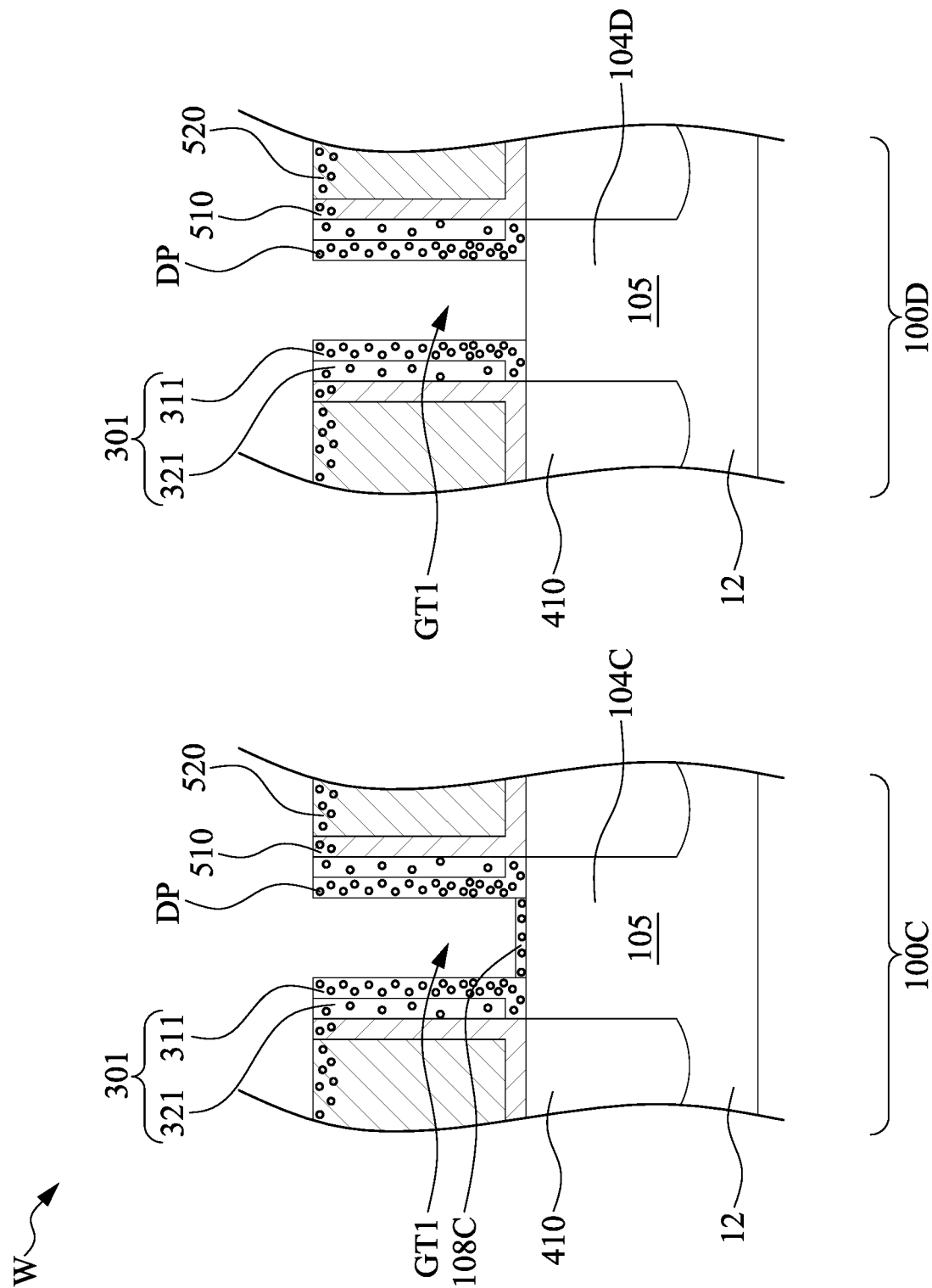
Figure 31:
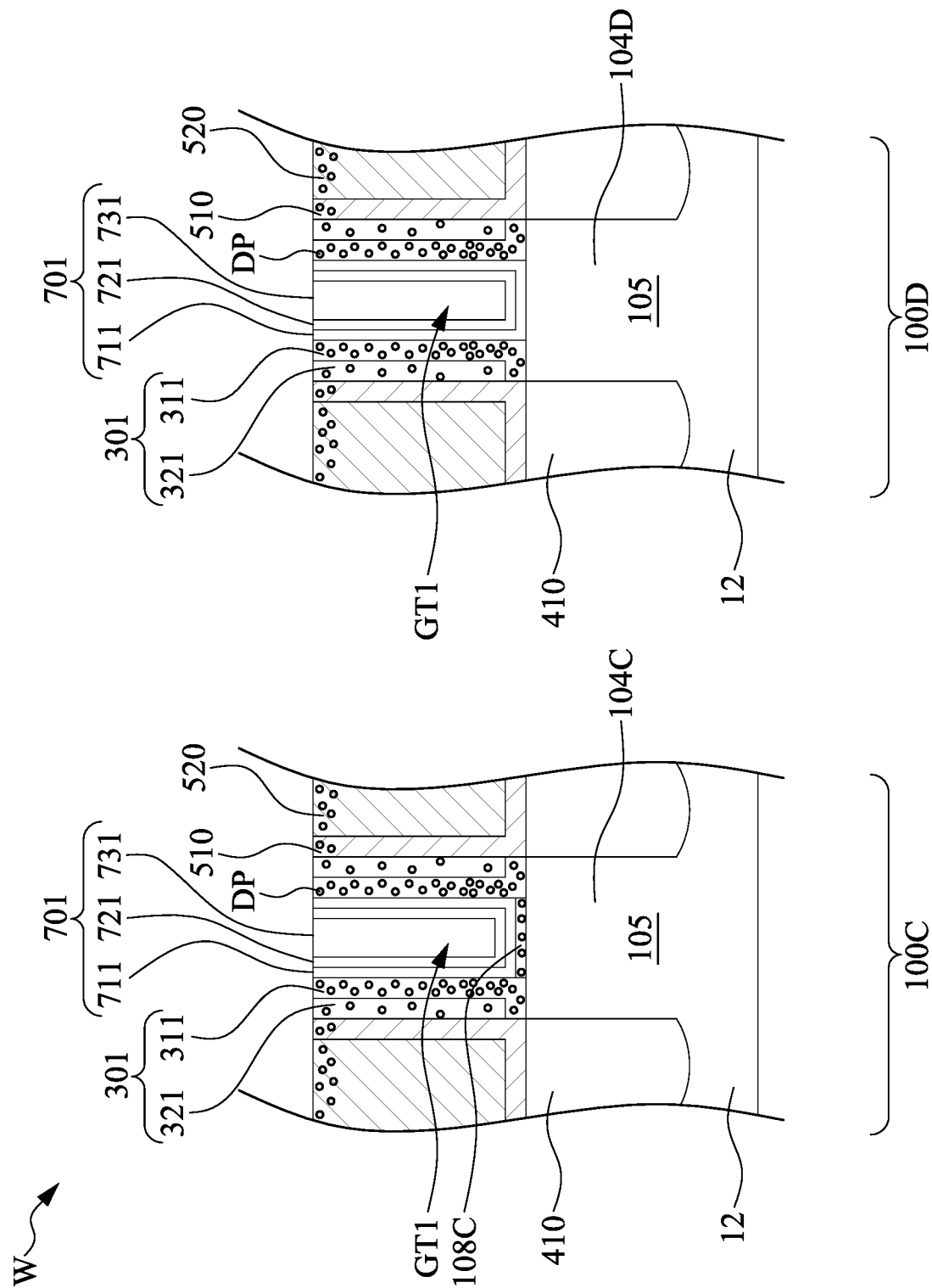

FIGS. 29-31 illustrate exemplary cross sectional views of various stages for manufacturing transistors according to some other embodiments of the present disclosure. It is understood that additional operations can be provided before, during, and after processes shown by FIGS. 29-31, and some of the operations described below can be replaced or eliminated, for additional embodiments of the method. The order of the operations/processes may be interchangeable. The same or similar configurations, materials, processes and/or operation as described with FIGS. 1-17 may be employed in the following embodiments, and the detailed explanation may be omitted.

FIG. 29 illustrates two first device regions 100C and 100D after performing step S26 in the process flow as shown in FIG. 18B. The first device regions 100C and 100D have substantially the same structures. For example, epitaxy structures 410 formed in the first device regions 100C and 100D have the same conductivity type (e.g., n-type or p-type), and the gate spacers 301 formed in the first device regions 100C and 100D have substantially the same inner interfaces with L-shaped cross section.

After step S26 in the process flow as shown in FIG. 18B is performed (i.e., the dopant source layer is removed from the first device regions 100C and 100D), a photoresist mask PR5 (e.g., a single-layer photoresist or a tri-layer photoresist) is applied and patterned to cover the first device region 100C and leaves the device region 100D uncovered, as shown in FIG. 29. Next, the interfacial layer 108D is removed from the first device region 100D, followed by removing the photoresist mask PR5 in an ashing step, such as using oxygen plasma. The resulting structure is illustrated in FIG. 30. As a result of the steps as shown in FIGS. 29 and 30, the interfacial layer 108C remains on the semiconductor fin 104C, but the semiconductor fin 104D is free from coverage by the interfacial layer 108D. In this way, the device formed in the device region 100C can be an I/O device, and the interfacial layer 108C can act as an I/O oxide layer which is thick enough to provide protection from electrostatic discharge (ESD) events. On the contrary, the device formed in the first device region 100D can be a non-I/O device (e.g., core device) without the I/O oxide layer. In such embodiments, the device region 100D is referred to as a core region and the device region 100C is referred to as an I/O region.

Next, as shown in FIG. 31, two same replacement gate stacks 701 (e.g., having same work function conductors) are formed in the I/O region 100C and the core region 100D, respectively. This process step is similar to that of FIG. 17, and thus details thereof are not repeated for the sake of brevity.

Figure 32:
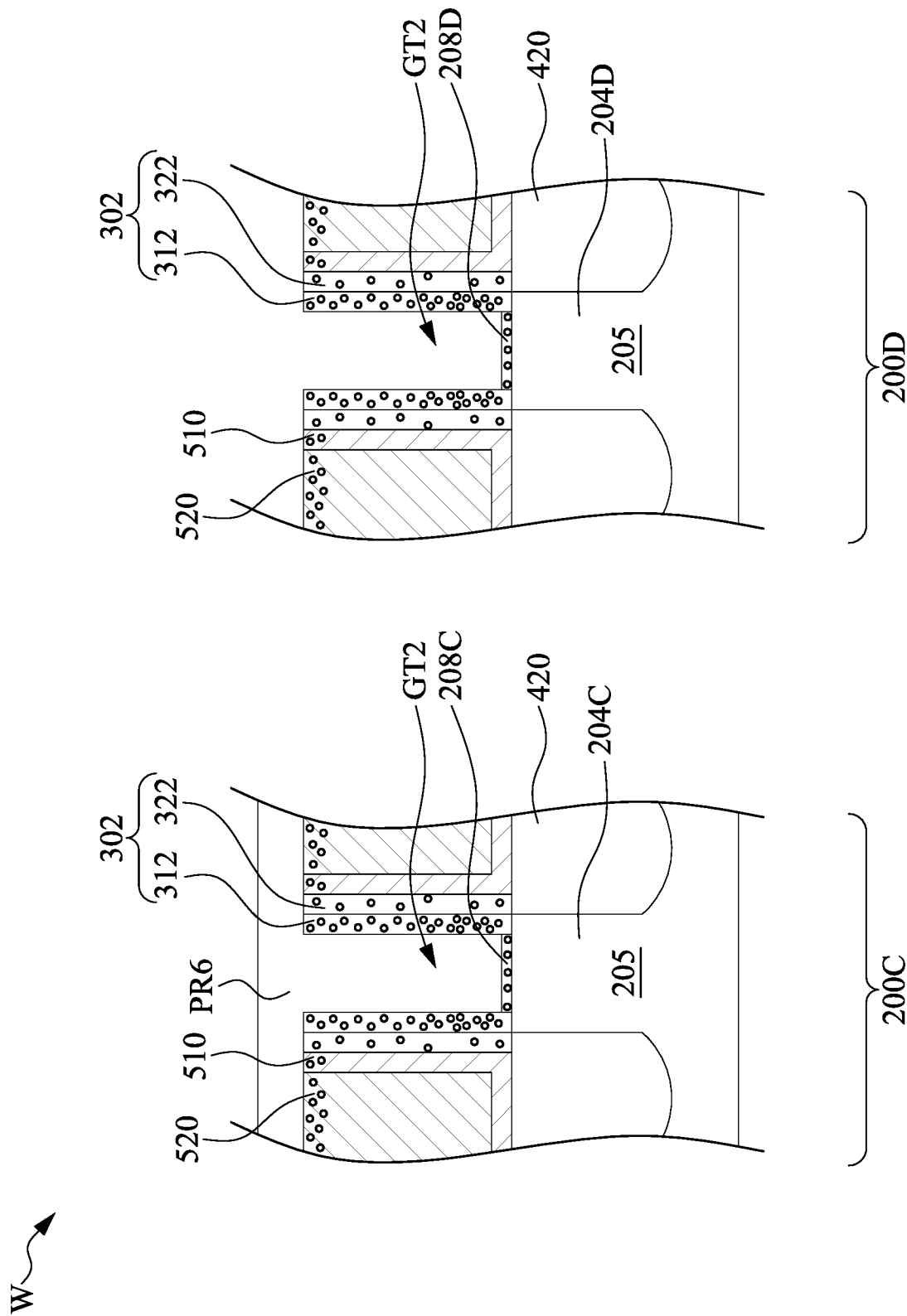
FIGS. 32-34 illustrate exemplary cross sectional views of various stages for manufacturing transistors according to some embodiments of the present disclosure.
Figure 33:
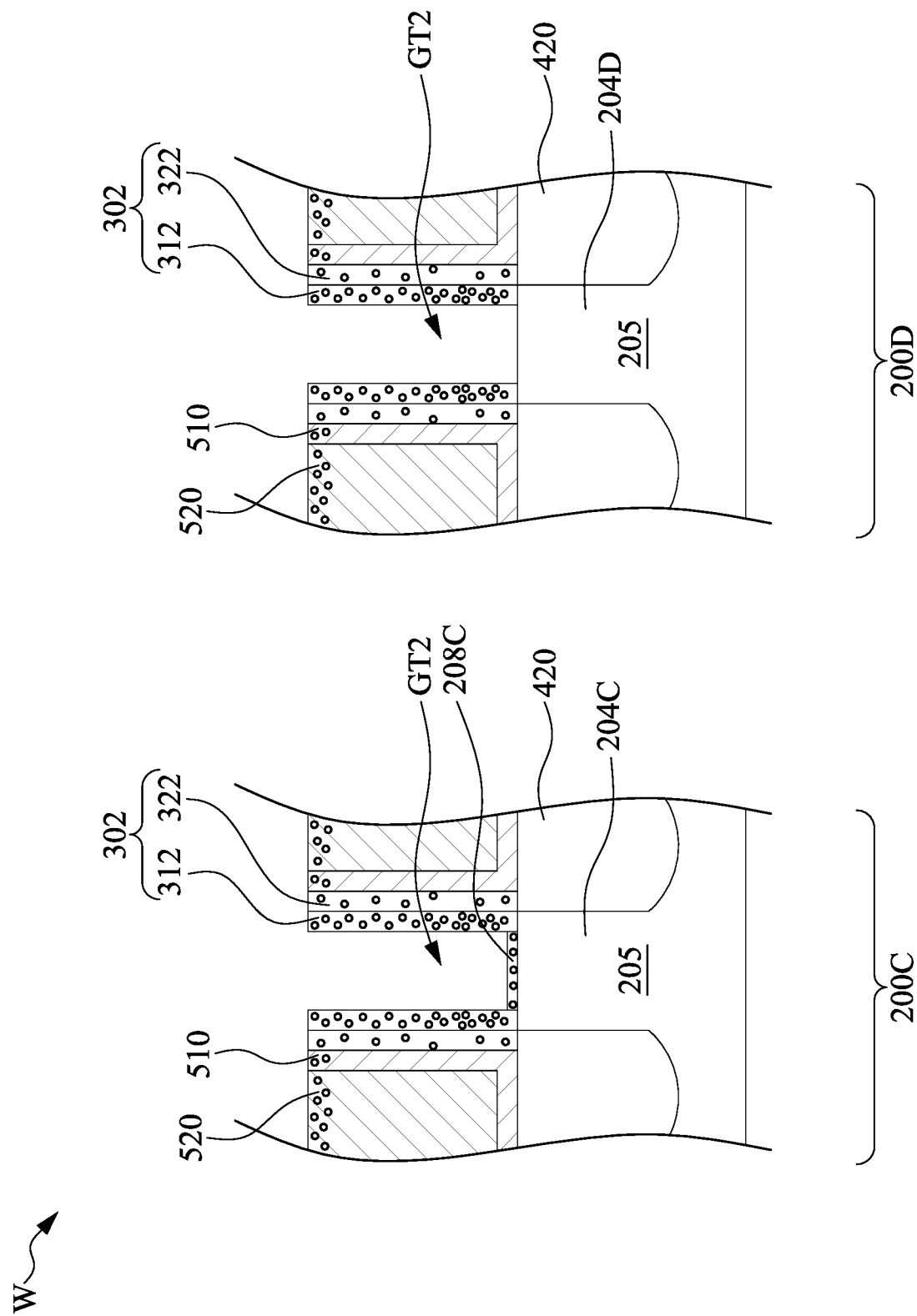
Figure 34:
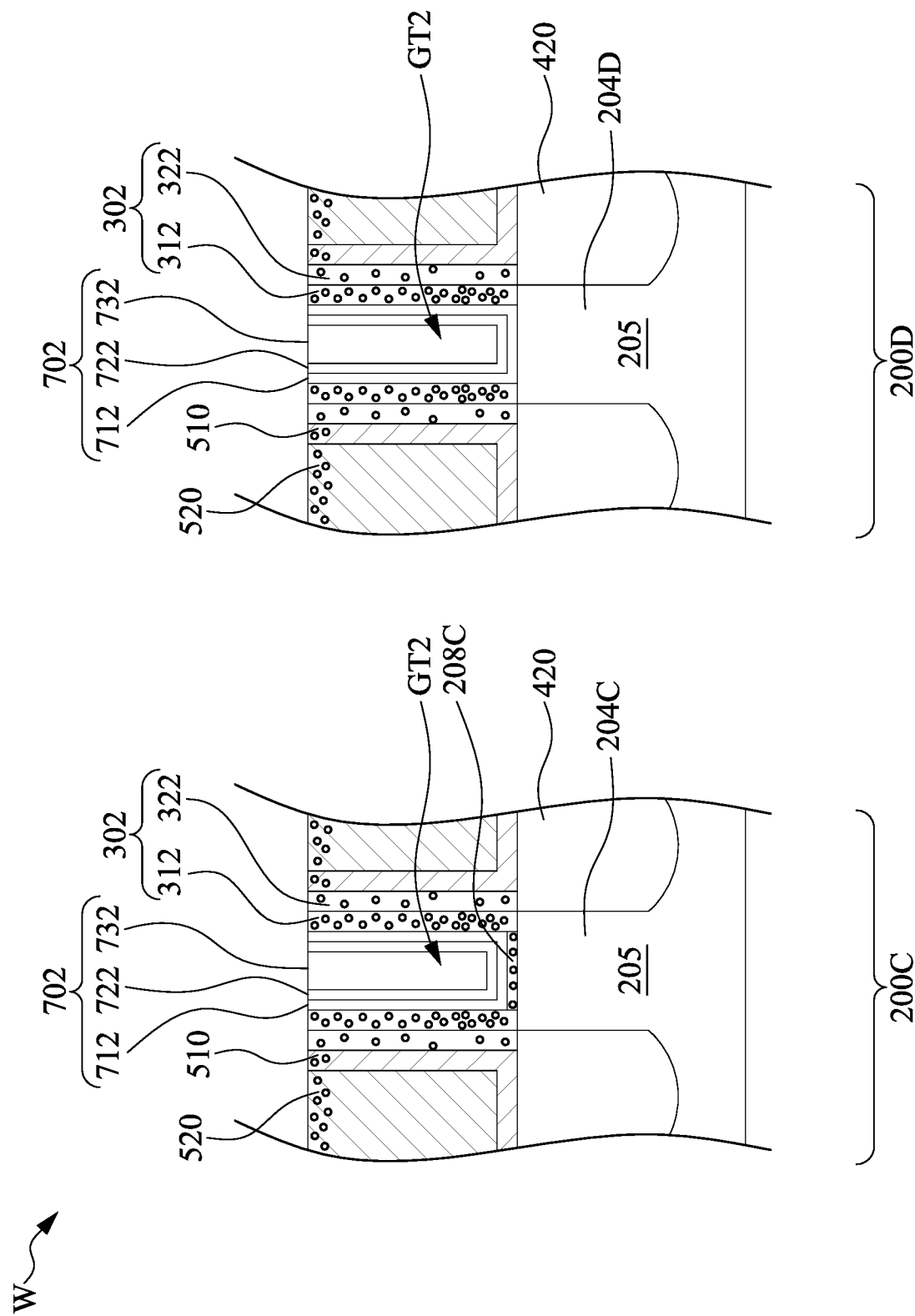

FIGS. 32-34 illustrate exemplary cross sectional views of various stages for manufacturing transistors according to some other embodiments of the present disclosure. It is understood that additional operations can be provided before, during, and after processes shown by FIGS. 32-34, and some of the operations described below can be replaced or eliminated, for additional embodiments of the method. The order of the operations/processes may be interchangeable. The same or similar configurations, materials, processes and/or operation as described with FIGS. 1-17 may be employed in the following embodiments, and the detailed explanation may be omitted.

FIG. 32 illustrates two second device regions 200C and 200D after performing step S26 in the process flow as shown in FIG. 18B. The second device regions 200C and 200D have substantially the same structures. For example, epitaxy structures 420 formed in the second device regions 200C and 200D have the same conductivity type (e.g., n-type or p-type), and the gate spacers 302 formed in the second device regions 200C and 200D have substantially the same inner interfaces with linear-shaped cross section.

After step S26 in the process flow as shown in FIG. 18B is performed (i.e., the dopant source layer is removed from the second device regions 200C and 200D), a photoresist mask PR6 (e.g., a single-layer photoresist or a tri-layer photoresist) is applied and patterned to cover the device region 200C and leaves the device region 200D uncovered, as shown in FIG. 32. Next, the interfacial layer 208D is removed from the device region 200D, followed by removing the photoresist mask PR6 in an ashing step, such as using oxygen plasma. The resulting structure is illustrated in FIG. 33. The interfacial layer 208C remains on the semiconductor fin 204C, but the semiconductor fin 204D is free from coverage by the interfacial layer 208D. In this way, the device formed in the device region 200C can be an I/O device, and the interfacial layer 208C can act as an I/O oxide layer which is thick enough to provide protection from electrostatic discharge (ESD) events. On the contrary, the device formed in the first device region 200D can be a non-I/O device (e.g., core device) without the I/O oxide layer. In such embodiments, the device region 200D is referred to as a core region and the device region 200C is referred to as an I/O region.

Next, as shown in FIG. 34, two same replacement gate stacks 702 (e.g., having same work function conductors) are formed in the I/O region 200C and the core region 200D, respectively. This process step is similar to that of FIG. 17, and thus details thereof are not repeated for the sake of brevity.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the doped gate spacer has a reduced dielectric constant as compared to the un-doped gate spacer, which in turn will reduce the parasitic capacitance and thus improve the resistance capacitance (RC) delay. Another advantage is that the gate spacers provide satisfactory protection for the fins and epitaxy source/drain regions from the etchant used in removal of polysilicon gate electrodes, because the gate spacers are still un-doped during the removal of polysilicon gate electrodes. Another advantage is that no additional mask is required for doping the gate spacers.

In some embodiments of the present disclosure, a method includes forming a dummy gate structure over a substrate; forming a plurality of gate spacers respectively on opposite sidewalls of the dummy gate structure, the gate spacers having a first dielectric constant; removing the dummy gate electrode to form a gate trench between the gate spacers; forming a dopant source layer to line the gate trench; annealing the dopant source layer to diffuse k-value reduction impurities from the dopant source layer into the gate spacers to lower the first dielectric constant of the gate spacers to a second dielectric constant; and forming a replacement gate stack in the gate trench.

In some embodiments of the present disclosure, a method includes forming a first gate dielectric layer over a substrate and a first dummy gate structure over the first gate dielectric layer; forming a plurality of first gate spacers alongside the first dummy gate structure; etching the first dummy gate structure to form a first gate trench between the first gate spacers; forming a dopant source layer over the first gate dielectric layer after etching the first dummy gate structure; annealing the dopant source layer such that first k-value reduction impurities in the dopant source layer are diffused into the first gate dielectric layer; and forming a first replacement gate stack in the first gate trench.

In some embodiments of the present disclosure, a semiconductor device includes a substrate, a gate stack over the substrate and a gate spacer on a sidewall of the gate stack. The gate spacer includes an outer spacer and an inner spacer between the gate stack and the outer spacer. The outer spacer and the inner spacer have same k-value reduction impurities, and a concentration of the k-value reduction impurities in the inner spacer is greater than a concentration of the k-value reduction impurities in the outer spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a dummy gate structure over a substrate;
   forming a plurality of gate spacers respectively on opposite sidewalls of the dummy gate structure, the gate spacers having a first dielectric constant;
   removing the dummy gate structure to form a gate trench between the gate spacers;
   forming a dopant source layer to line the gate trench;
   annealing the dopant source layer to diffuse k-value reduction impurities from the dopant source layer into the gate spacers to lower the first dielectric constant of the gate spacers to a second dielectric constant; and
   forming a replacement gate stack in the gate trench.

2. The method of claim 1, further comprising:
   removing the dopant source layer from the gate trench prior to forming the replacement gate stack.

3. The method of claim 2, wherein removing the dopant source layer is performed using an etchant same as an etchant used in removing the dummy gate structure.

4. The method of claim 2, wherein an etch duration of removing the dopant source layer is shorter than an etch duration of removing the dummy gate structure.

5. The method of claim 2, further comprising:
   forming a gate dielectric layer over the substrate prior to forming the dummy gate structure, wherein the gate dielectric layer remains over the substrate after removing the dopant source layer.

6. The method of claim 5, further comprising:
   removing the gate dielectric layer prior to forming the replacement gate stack.

7. The method of claim 1, wherein a material of the dopant source layer is same as a material of the dummy gate structure.

8. The method of claim 1, where the k-value reduction impurities are fluorine.

9. The method of claim 1, wherein the dopant source layer comprises polysilicon.

10. A method, comprising:
    forming a first gate dielectric layer over a substrate and a first dummy gate structure over the first gate dielectric layer;
    forming a plurality of first gate spacers alongside the first dummy gate structure;
    etching the first dummy gate structure to form a first gate trench between the first gate spacers;
    forming a dopant source layer over the first gate dielectric layer after etching the first dummy gate structure;
    annealing the dopant source layer such that first k-value reduction impurities in the dopant source layer are diffused into the first gate dielectric layer; and
    forming a first replacement gate stack in the first gate trench.

11. The method of claim 10, further comprising:
removing the first gate dielectric layer from the first gate trench prior to forming the first replacement gate stack.

12. The method of claim 10, further comprising:
forming a second gate dielectric layer over the substrate and a second dummy gate structure over the second gate dielectric layer;
forming a plurality of second gate spacers alongside the second dummy gate structure; and
etching the second dummy gate structure to form a second gate trench between the second gate spacers, wherein the second gate dielectric layer remains over the substrate after etching the second dummy gate structure,
wherein annealing the dopant source layer is performed such that second k-value reduction impurities in the dopant source layer are diffused into the second gate dielectric layer.

13. The method of claim 12, wherein forming the dopant source layer is performed such that the dopant source layer is further formed over the second gate dielectric layer.

14. The method of claim 10, wherein forming the dopant source layer comprises:
depositing a polysilicon layer over the first gate dielectric layer; and
doping the polysilicon layer with fluorine.

15. The method of claim 14, wherein doping the polysilicon layer is in-situ performed with depositing the polysilicon layer.

16. A method, comprising:
forming a first dummy gate electrode over an n-type field-effect transistor (NFET) region of a substrate, and a second dummy gate electrode over a p-type field-effect transistor (PFET) region of the substrate;
forming first gate spacers on either side of the first dummy gate electrode, and second gate spacers on either side of the second dummy gate electrode;
etching the first and second dummy gate electrodes, resulting in a first gate trench between the first gate spacers and a second gate trench between the second gate spacers;
after etching the first and second dummy gate electrodes, depositing a dopant source layer spanning across both the NFET region and the PFET region;
performing an annealing process such that k-value reduction impurities in the dopant source layer are diffused into the first gate spacers and the second gate spacers; and
after performing the annealing process, forming an NFET gate structure in the first gate trench and a PFET gate structure in the second gate trench.

17. The method of claim 16, further comprising:
forming an interlayer dielectric (ILD) layer laterally around the first gate spacers and the second gate spacers, wherein the annealing process also results in diffusing the k-value reduction impurities into the ILD layer.

18. The method of claim 16, further comprising:
forming n-type epitaxy structures on either side of the first dummy gate electrode, and p-type epitaxy structures on either side of the second dummy gate electrode, wherein after the annealing process, the n-type epitaxy structures and the p-type epitaxy structures are free of the k-value reduction impurities.

19. The method of claim 16, further comprising:
forming a first interfacial layer below the first dummy gate electrode, and a second interfacial layer below the second dummy gate electrode, wherein the dopant source layer is deposited on both the first interfacial layer and the second interfacial layer.

20. The method of claim 19, wherein the annealing process also results in diffusing the k-value reduction impurities into both the first interfacial layer and the second interfacial layer.

* * * * *